(12) United States Patent
Kim et al.

(10) Patent No.: US 10,847,244 B2
(45) Date of Patent: Nov. 24, 2020

(54) STORAGE DEVICE INCLUDING REPAIRABLE VOLATILE MEMORY AND METHOD OF OPERATING THE SAME

(71) Applicant: Samsung Electronics Co., Ltd., Suwon-si (KR)

(72) Inventors: Sang-hun Kim, Asan-si (KR); Jun-Ki Sung, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 125 days.

(21) Appl. No.: 15/695,366

(22) Filed: Sep. 5, 2017

(65) Prior Publication Data

US 2018/0158535 A1 Jun. 7, 2018

(30) Foreign Application Priority Data

Dec. 7, 2016 (KR) .................. 10-2016-0166206

(51) Int. Cl.
| | |
|---|---|
| *G11C 29/38* | (2006.01) |
| *G11C 29/44* | (2006.01) |
| *G11C 29/00* | (2006.01) |
| *G11C 29/36* | (2006.01) |
| *G11C 29/04* | (2006.01) |

(52) U.S. Cl.
CPC .............. *G11C 29/38* (2013.01); *G11C 29/44* (2013.01); *G11C 29/783* (2013.01); *G11C 29/36* (2013.01); *G11C 2029/0409* (2013.01); *G11C 2029/4402* (2013.01)

(58) Field of Classification Search
CPC . G11C 16/0483; G11C 29/4401; G11C 29/44; G11C 2029/0409; G11C 29/785; G11C 29/38; G11C 29/783; G11C 2029/4402; G11C 29/36; G11C 29/56

USPC ......................................................... 714/763

See application file for complete search history.

(56) References Cited

U.S. PATENT DOCUMENTS

| 6,704,228 | B2 | 3/2004 | Jang et al. | |
|---|---|---|---|---|
| 6,845,477 | B2 * | 1/2005 | Hidaka | G11C 29/48 |
| | | | | 324/757.03 |
| 7,178,072 | B2 * | 2/2007 | Mullins | G11C 29/44 |
| | | | | 714/711 |
| 7,187,603 | B2 | 3/2007 | Nagata et al. | |
| 7,286,400 | B2 * | 10/2007 | Kojima | G11C 16/0483 |
| | | | | 365/185.09 |

(Continued)

FOREIGN PATENT DOCUMENTS

| JP | 2006-286135 A | 10/2006 |
|---|---|---|
| JP | 2007-250090 A | 9/2007 |

(Continued)

*Primary Examiner* — James C Kerveros
(74) *Attorney, Agent, or Firm* — Harness, Dickey & Pierce, P.L.C.

(57) ABSTRACT

A storage device including repairable volatile memory and a method of operating the same are provided. The storage device includes a non-volatile memory storing user data, a volatile memory buffering the user data and performing a test for detecting a defective cell on a volatile cell array at an idle time of the storage device, and a controller controlling the volatile memory to perform the test at an idle time and storing test information including a test result or a test history in the non-volatile memory.

20 Claims, 22 Drawing Sheets

(56) References Cited

U.S. PATENT DOCUMENTS

| | | | | |
|---|---|---|---|---|
| 7,350,137 B2* | 3/2008 | Foss | ............... | G06F 11/1064 714/805 |
| 7,397,719 B2* | 7/2008 | Takahashi | ............ | G11C 11/406 365/185.08 |
| 7,469,369 B2* | 12/2008 | Matsuoka | ............ | G11C 15/00 714/718 |
| 7,484,138 B2* | 1/2009 | Hsieh | ............... | G11C 29/24 714/710 |
| 7,679,133 B2 | 3/2010 | Son et al. | | |
| 7,805,645 B2* | 9/2010 | Frey | ............... | G11C 29/50 714/718 |
| 8,069,377 B2* | 11/2011 | Singh | ............... | G01J 3/02 714/711 |
| 8,086,919 B2* | 12/2011 | Chen | ............... | G11C 29/16 714/723 |
| 8,120,957 B2* | 2/2012 | Tokiwa | ............... | G11C 16/06 365/185.09 |
| 8,553,466 B2 | 10/2013 | Han et al. | | |
| 8,559,235 B2 | 10/2013 | Yoon et al. | | |
| 8,654,587 B2 | 2/2014 | Yoon et al. | | |
| 2011/0233648 A1 | 9/2011 | Seol et al. | | |
| 2013/0232384 A1* | 9/2013 | Yoel | ............... | G11C 29/24 714/710 |
| 2015/0286529 A1* | 10/2015 | Lunde | ............... | G06F 11/1048 714/764 |
| 2015/0363309 A1* | 12/2015 | Lai | ............... | G06F 12/0246 711/103 |
| 2016/0062819 A1* | 3/2016 | Oh | ............... | G11C 29/4401 714/6.11 |

FOREIGN PATENT DOCUMENTS

| | | |
|---|---|---|
| JP | 5038788 B2 | 10/2012 |
| JP | 2014-032726 A | 2/2014 |
| KR | 10-0498456 B1 | 7/2005 |
| KR | 10-2016-0027571 A | 3/2016 |

\* cited by examiner

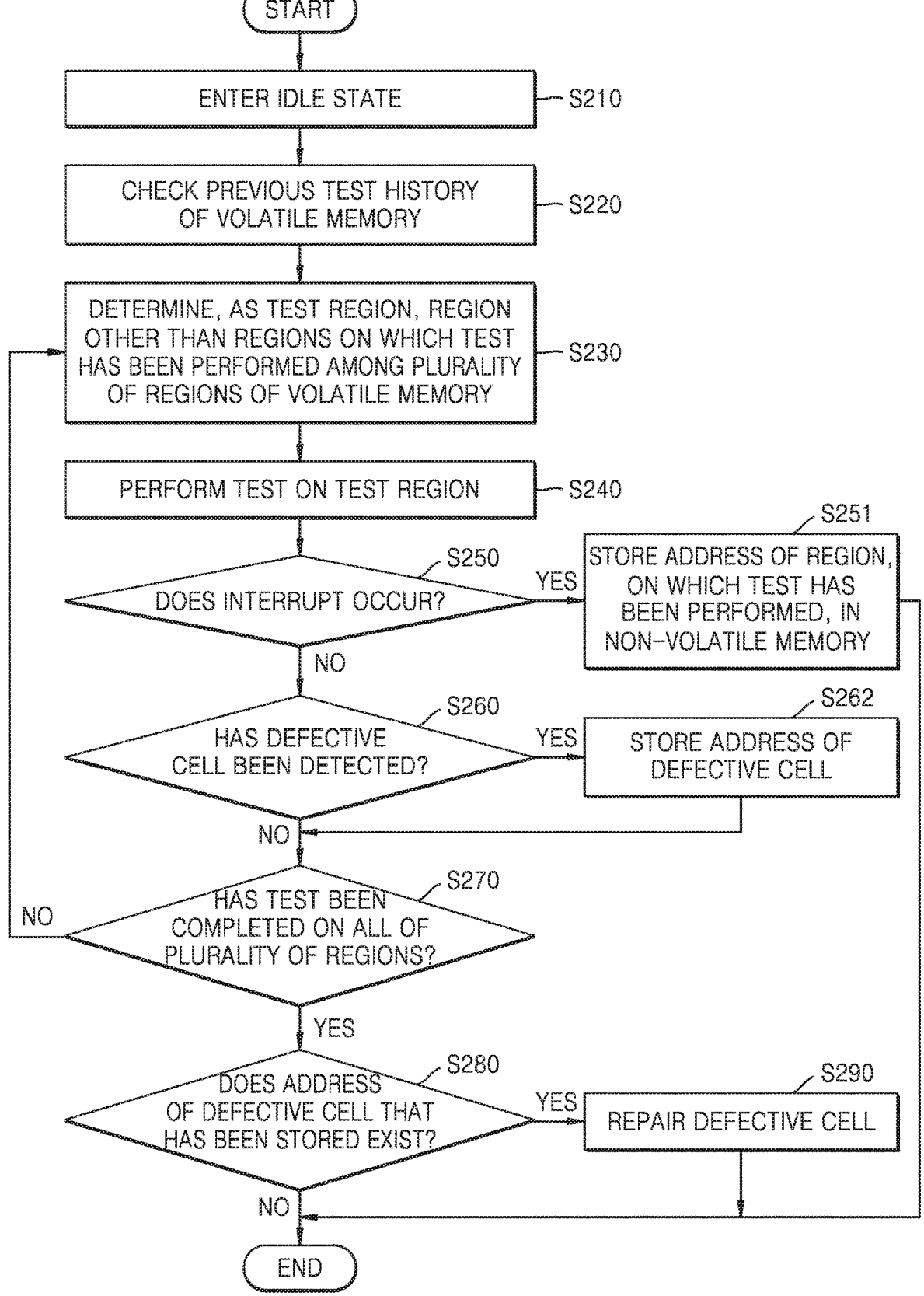

STORAGE DEVICE INCLUDING REPAIRABLE VOLATILE MEMORY AND METHOD OF OPERATING THE SAME

CROSS-REFERENCE TO RELATED APPLICATION

This application claims the benefit of Korean Patent Application No. 10-2016-0166206, filed on Dec. 7, 2016, in the Korean Intellectual Property Office, the disclosure of which is incorporated herein in its entirety by reference.

BACKGROUND

Inventive concepts relate to a storage device, and more particularly, to a storage device using volatile memory as main memory, and a method of operating the same.

A non-volatile memory device as a semiconductor memory device may include memory cells storing data in a non-volatile way. For example, a flash memory may be used in various types of storage devices such as a memory card and a solid state drive (SSD). Storage devices may be used in various electronic systems such as mobile phones, digital cameras, personal digital assistants (PDA), mobile computing systems, and stationary computing systems.

A storage device may write and read data at the request of a host. A storage device may include a plurality of flash memory devices and may perform memory operations, such as data write and data read, on the flash memory devices through a plurality of channels. A storage device may include volatile memory. For example, a storage device may include a dynamic random access memory (DRAM) buffer) which temporarily stores data. Write data and/or read data may temporarily be stored in the volatile memory.

SUMMARY

Inventive concepts provides a storage device for detecting defective cells with abnormal characteristics in volatile memory used as main memory while reducing the likelihood of performance deterioration or degradation, and preventing, or reducing the likelihood of, data errors from occurring and a method of operating the same.

In an example embodiment of inventive concepts, there is provided a storage device including a non-volatile memory storing user data; a volatile memory buffering the user data and performing a test for detecting a defective cell on a volatile cell array at an idle time of the storage device; and a controller controlling the volatile memory to perform the test at the idle time and storing test information, which is generated based on the performing of the test, in the non-volatile memory.

In an example embodiment of inventive concepts, there is provided a method of operating the storage device. The method includes entering an idle state in which there is no data transmission and reception to and from an external device, performing a test for detecting a defective cell on the volatile memory, storing test information of a test process which has been performed in the non-volatile memory, and repairing a defective cell detected according to the test information.

BRIEF DESCRIPTION OF THE DRAWINGS

Embodiments of inventive concepts will be more clearly understood from the following detailed description taken in conjunction with the accompanying drawings in which:

FIG. 12 is a flowchart of a method of operating a storage device according to an embodiment of inventive concepts;

DETAILED DESCRIPTION OF THE EMBODIMENTS

Figure 1:
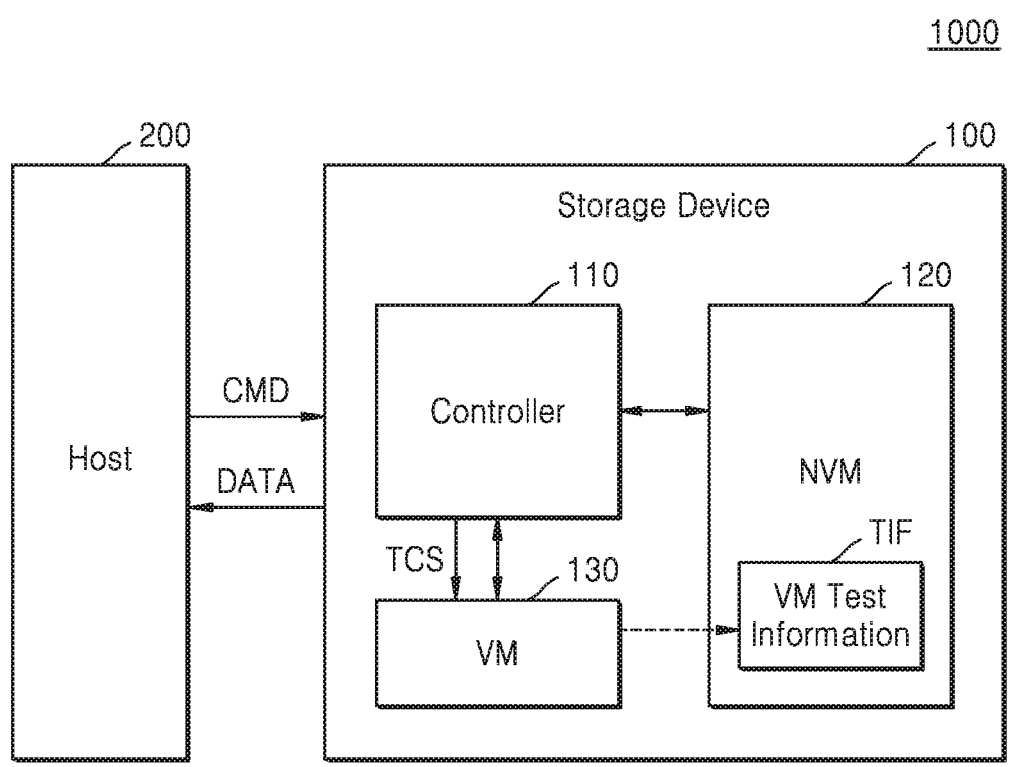
FIG. 1 is a block diagram of a storage system according to an embodiment of inventive concepts.

FIG. 1 is a block diagram of a storage system according to an embodiment of inventive concepts.

Referring to FIG. 1, a storage system 1000 may include a host 200 and a storage device 100. The storage device 100 may be or may include a solid state drive (SSD). However, inventive concepts are not limited thereto and the storage device 100 may be or may include a device including volatile memory. For instance, the storage device 100 may be implemented as or may include one of various types of devices such as an embedded multimedia card (eMMC), universal flash storage (UFS), compact flash (CF), secured digital (SD), micro SD, mini SD, extreme digital (xD), and/or a memory stick.

The storage device 100 may communicate with the host 200 using various interfaces. The host 200 may request a data processing operation, such as a data read operation and/or a data write operation, of the storage device 100. The host 200 may correspond to a central processing unit (CPU), a processor, a microprocessor, or an application processor (AP). The host 200 may be implemented as or may include a system-on-a-chip (SoC).

Various types of interfaces, such as advanced technology attachment (ATA), serial ATA (SATA), external SATA (e-SATA), small computer small interface (SCSI), serial attached SCSI (SAS), peripheral component interconnection (PCI), PCI express (PCI-E), IEEE 1384, a universal serial bus (USB) interface, an SD card interface, an MMC interface, an eMMC interface, and a CF card interface, may be used for communication between the storage device 100 and the host 200.

The storage device 100 may include a controller 110, a non-volatile memory (NVM) 120, and a volatile memory (VM) 130. The VM 130 may be used as main memory of the storage device 100.

The NVM 120 may include a plurality of NVM cells. For instance, the NVM 120 may include a plurality of flash memory cells. The flash memory cells may be NAND flash memory cells. Hereinafter, embodiments of inventive concepts will be described using, as an example, a case where a plurality of memory cells include NAND flash memory cells. However, inventive concepts are not limited to this example and a plurality of memory cells may be or may include various types of NVM cells. For instance, memory cells may be or may include resistive memory cells, such as resistive random access memory (ReRAM) cells, phase change RAM (PRAM) cells, and magnetic RAM (MRAM) cells.

The NVM 120 may be or may include a two-dimensional (2D) or a three-dimensional (3D) memory array. A 3D memory array may be monolithically formed at at least one physical level of memory cell arrays, which have an active region disposed on a silicon substrate and a circuit involved in the operation of memory cells and formed on or in the substrate. The term "monolithic" means that layers of each level of an array are directly deposited on layers of an underlying level of the array. In some embodiments of inventive concepts, the 3D memory array includes vertical NAND strings which are arranged in a vertical direction so that at least one memory cell is placed on another memory cell. The at least one memory cell may include a charge trap layer.

Structures of a 3D memory array, in which the 3D memory array includes a plurality of levels and word lines and/or bit lines are shared by levels, are disclosed in U.S. Pat. Nos. 7,679,133, 8,553,466, 8,654,587, 8,559,235, and U.S. Patent Application No. 2011/0233648, the disclosures of which are incorporated herein by references.

The controller 110 controls all operations of the storage device 100 and controls memory operations, such as a data write operation and a data read operation, of the NVM 120.

The VM 130 may temporarily store data during data write and read operations of the storage device 100. For example, the VM 130 may buffer data to be written to or read from the NVM 120. The data may include user data. The VM 130 may also store information relevant to the actuation of the storage device 100. For example, the VM 130 may store metadata of the NVM 120. The VM 130 may be implemented as or may include dynamic RAM (DRAM) or static RAM (SRAM), however, inventive concepts are not limited thereto. The VM 130 may include write data memory which temporarily stores write data and read data memory which temporarily stores read data. Alternatively, the controller 110 may include the VM 130.

The VM 130 may perform a test for detecting defective cells during an idle time and may repair, reroute, and/or replace the defective cells when the storage device 100 is in an idle state. The idle state of the storage device 100 may include a low-power state and a sleep state, and/or the like, in which no data and signals are exchanged between the host 200 and the storage device 100.

For example, the VM 130 may test cells for at least one characteristic among a refresh characteristic, a frequency characteristic, an alternating current (AC) parameter characteristic, and a direct current (DC) parameter characteristic. However, inventive concepts are not limited to this example and the VM 130 may test various kinds of characteristics.

The VM 130 may test the characteristic by writing a test pattern to a memory cell array and reading the data from the memory cell array based on various desired conditions, or conditions that have been set in advance. In the embodiments of inventive concepts, a defective cell refers to a memory cell having a characteristic that is currently below a standard and may thus cause a data. A defective cell may also refer to a memory cell, e.g., a weak cell having a characteristic that is likely to deteriorate afterwards, and may thus cause a data error.

The controller 110 may sense that the storage device 100 has entered an idle state, and may send the VM 130 a test control signal TCS instructing the VM 130 to perform a test. The controller 110 may receive a test request for the VM 130 from the host 200 and may send the test control signal TCS to the VM 130 at an idle time after the controller 110 receives the test request.

The controller 110 may generate the test control signal TCS based on a predefined, and/or specific, test algorithm. The test algorithm may be implemented by or may include firmware or software which includes test code or may be implemented by or may include hardware.

The test control signal TCS may include a test command, an address of a region on which a test will be performed, a test step (or a test type), and a test condition. The test condition may be an acceleration condition (or an edge, corner, or pathological condition) for increasing the occurrence of a defective cell. For example, if a refresh interval used in a normal or nominal operation of the storage device 100 is 30 milliseconds (ms), the acceleration condition may be set to a longer period, e.g., 80 ms, than 30 ms.

The controller 110 may store test information TIF, which includes a test result or a test history, in the NVM 120.

In some example embodiments, the controller 110 may control the VM 130 to stop testing when an interrupt occurs in the storage device 100 and may store the test information TIF about a test process, which has been performed until the occurrence of the interrupt, in the NVM 120. The interrupt may occur at the data write or read request of the host 200 or may occur due to the internal state of the storage device 100.

In other embodiments, the controller 110 may control the VM 130 to stop testing when a sudden power off occurs in the storage device 100 and may store the test information TIF about a test process, which has been performed until that point, in the NVM 120.

A test history included in the test information TIF may include information about an address of a region on which a test has been performed among a plurality of regions of the VM 130. The test history may also include information about at least one test step performed until the occurrence of an interrupt among a plurality of test steps sequentially performed to detect a defective cell. When the VM 130 performs a test multiple times under variable test conditions, the test history may include information about test conditions which have applied until the occurrence of the interrupt among the variable test conditions. For example, the test history may include information about a region on which a test is performed when an interrupt occurs, a test step, and/or a test condition.

In some example embodiments, during an idle time after an operation corresponding to the interrupt is performed, the controller 110 may check a test process performed at a previous idle time based on the test information TIF stored in the NVM 120 and may determine a test process to be performed on the VM 130 at a current idle time based on the check result.

In other example embodiments, the controller 110 may control the VM 130 to stop testing when the controller 110 senses a sudden power off of the storage device 100 during the testing, and may store the test information TIF about a test process, which has been performed until the sudden power off, in the NVM 120.

Repairing a defective cell that has been detected may include hardware repair or software repair. For example, the VM 130 may repair a defective cell in hardware by replacing the defective cell with a redundancy cell in an internal volatile cell array. When data read from the VM 130 includes a bit corresponding to a defective cell, the controller 110 may repair the defective cell with software by applying recovery code to the data.

The controller 110 may control a test of the VM 130 to be periodically performed. For example, the controller 110 may control the test to be performed at intervals of some months. At this time, the test may also be performed when the storage device 100 is in an idle state.

As described above, the VM 130 may store data for the actuation of the storage device 100. Accordingly, if or when a failure occurs in the VM 130, data loss in the storage device 100 may occur. According to the embodiments of inventive concepts, the storage device 100 may test the VM 130 under the acceleration condition, detect a defective cell in advance, and repair the defective cell, thereby preventing, or reducing the likelihood of, occurrence of a failure. In addition, a test may be performed at an idle time, and when an interrupt occurs, test information may be stored in the NVM 120 before the test is stopped, so that the integrity of the VM 130 may be more likely to be maintained and performance deterioration or degradation of the storage device 100 may be minimized or reduced.

Figure 2:
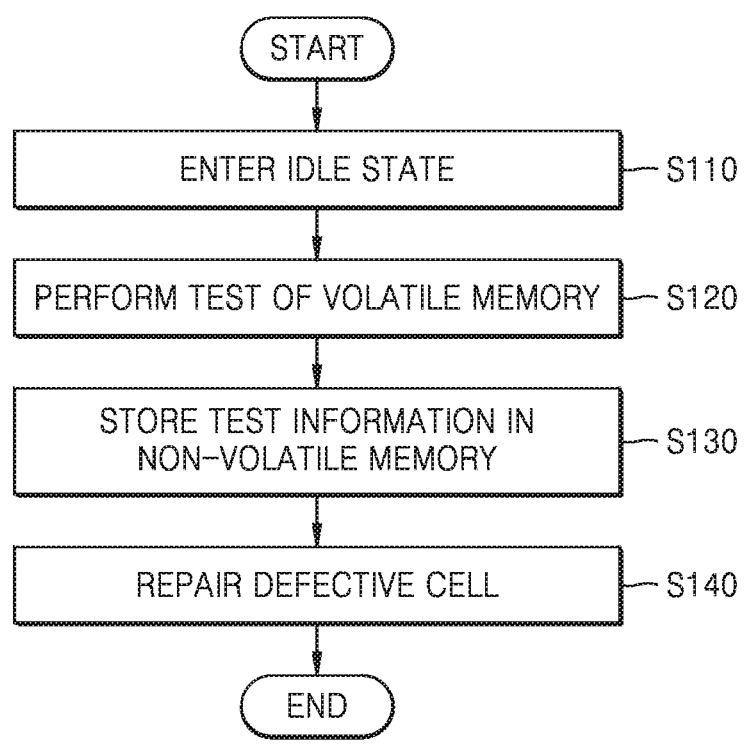
FIG. 2 is a flowchart of a method of operating a storage device according to an embodiment of inventive concepts.

FIG. 2 is a flowchart of a method of operating a storage device according to an example embodiment of inventive concepts. The storage device 100 of FIG. 1 may perform the method shown in FIG. 2, and therefore, FIG. 1 is also referred to in the description of the method.

Referring to FIG. 2, the storage device 100 may enter an idle state in operation S110. For example, when a read or write request is not received from the host 200 during a predefined and/or specific time period, the controller 110 may sense that the storage device 100 has entered the idle state. Alternatively or additionally, the host 200 may request the storage device 100 to enter the idle state.

When the storage device 100 enters the idle state, the storage device 100 may perform a test of the VM 130 to detect a defective cell in operation S120. As described above, the refresh characteristic, the frequency characteristics, AC parameter characteristics and DC parameter characteristics of the VM 130 may be tested based on the predefined and/or specific test algorithm. The storage device 100 may test these characteristics by writing a test pattern to the VM 130 and reading data from the VM 130 based on a predefined and/or specific acceleration condition.

The storage device 100 may store the test information TIF about the test performed on the VM 130 in the NVM 120 in operation S130. The test information TIF may include a test result and/or a test history. When an interrupt occurs in the storage device 100, test information about a test process performed until the occurrence of the interrupt may be stored in the NVM 120. The test process may be identified by a plurality of regions of the VM 130, a plurality of test steps, and/or a plurality of test conditions. Accordingly, the test history may include a test step, a test condition, and a region on which the test is being performed at the time of the occurrence of the interrupt. The test result may include a pass/fail result of the test process performed until the occurrence of the interrupt. When or if the test process determines the occurrence of a defective cell, the test result may include address information of the defective cell. The address information may include but is not limited to be a row address and/or a column address. The row address may include a word line address, and the column address may include a bit line address.

The storage device 100 may repair the defective cell detected in the VM 130 through the test in operation S140. The storage device 100 may repair the defective cell with hardware by replacing the defective cell with a redundancy cell. For example, the memory cell array of the VM 130 may include a redundancy block and the defective cell may be replaced by a redundancy cell. Alternatively or additionally, the storage device 100 may repair the defective cell with software by applying recovery code to a bit corresponding to the defective cell.

Repairing a defective cell with software may refer to recovering an error bit. For example, when data read from the VM 130 includes a bit corresponding to a defective cell, the storage device 100 may apply recovery code to the data, thereby preventing, or reducing the likelihood of, an error from occurring in the data or recovering the data.

Figure 3:
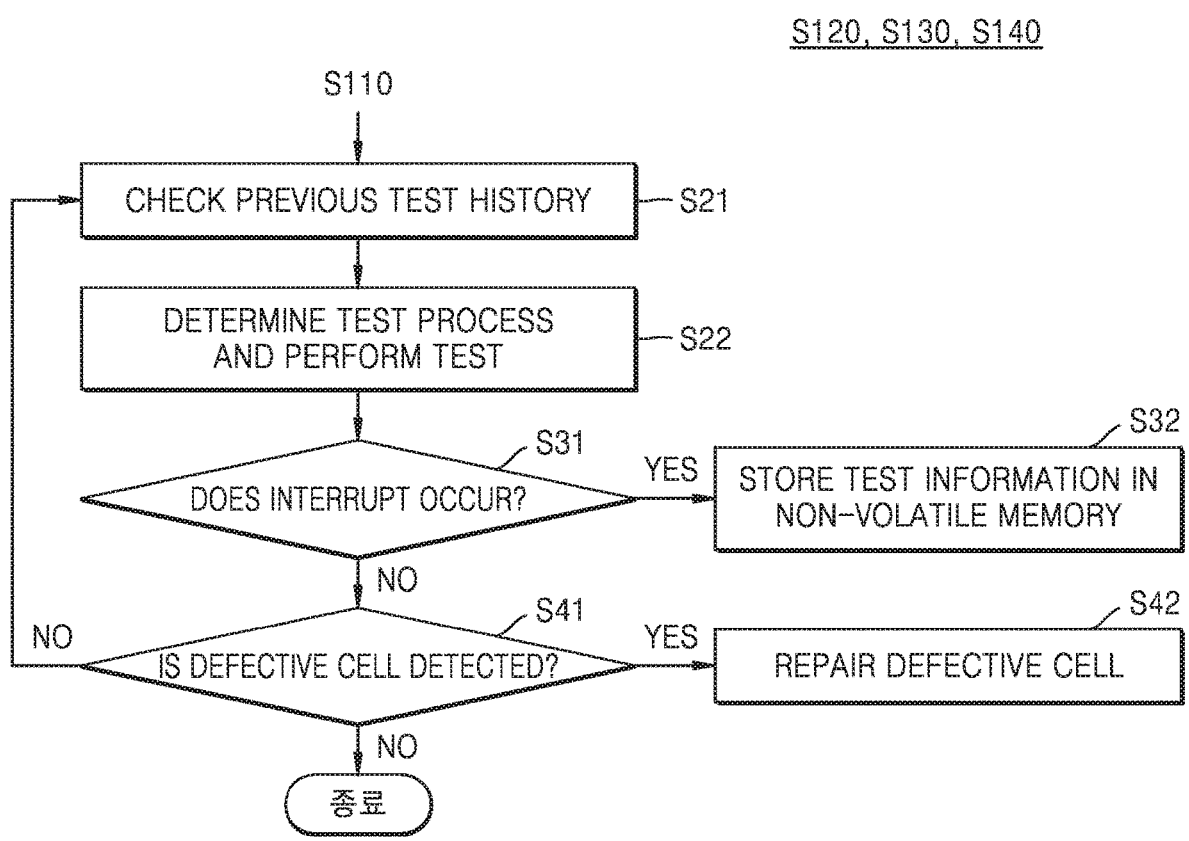
FIG. 3 is a flowchart of a method of operating a storage device according to an embodiment of inventive concepts.

FIG. 3 is a flowchart of a method of operating a storage device according to an example embodiment of inventive concepts. FIG. 3 shows operation of the storage device 100 when an interrupt occurs in the storage device 100 during a test of the VM 130, and presents operations S120, S130, and S140 shown in FIG. 2 in detail.

Referring to FIG. 3, the storage device 100 may check a test history of a previous test in operation S21. The storage device 100 may check a region on which the previous test is performed, and a test step and a test condition of the previous test. When or if the previous test has not been stopped by an interrupt, operation S21 may be omitted.

The storage device 100 may determine a test process and perform a test according to the test process in operation S22. For example, the storage device 100 may determine a region on which the test will be performed among a plurality of regions of the VM 130, a test step, and a test condition. The storage device 100 may perform the test according to the determined test process. The VM 130 may perform the test according to the process under the control of the controller 110.

The storage device 100 may sense an occurrence of an interrupt during the test in operation S31. For example, the storage device 100 may check whether an interrupt has occurred after performing the test on one region of the VM 130.

When or if an interrupt has occurred, the storage device 100 may store test information about the test that has been performed until the occurrence of the interrupt, e.g., a test result or a test history, in the NVM 120 in operation S32. After storing the test information in the NVM 120, the storage device 100 may stop the test of the VM 130 and may perform an operation corresponding to the interrupt. For example, the storage device 100 may enter a normal state and perform a normal or nominal operation, such as a data read operation and/or a data write operation.

When no interrupt has occurred, the storage device 100 may continue the test of the VM 130 and, after the test of every region of the VM 130 is completed, may determine whether a defective cell has occurred in operation S41. Alternatively, the controller 110 may determine whether a defective cell has occurred whenever the test is completed on each of the regions of the VM 130.

When the test process indicates the occurrence of a defective cell, the storage device 100 may repair the defective cell in operation S42. As described above with reference to FIG. 2, the storage device 100 may repair the defective cell with hardware or software.

Thereafter, the storage device 100 may end the test, or continuously perform the test on the VM 130. The storage device 100 may change a test process by changing a test condition or a test step and may perform a test according to the changed test process.

Figure 4:
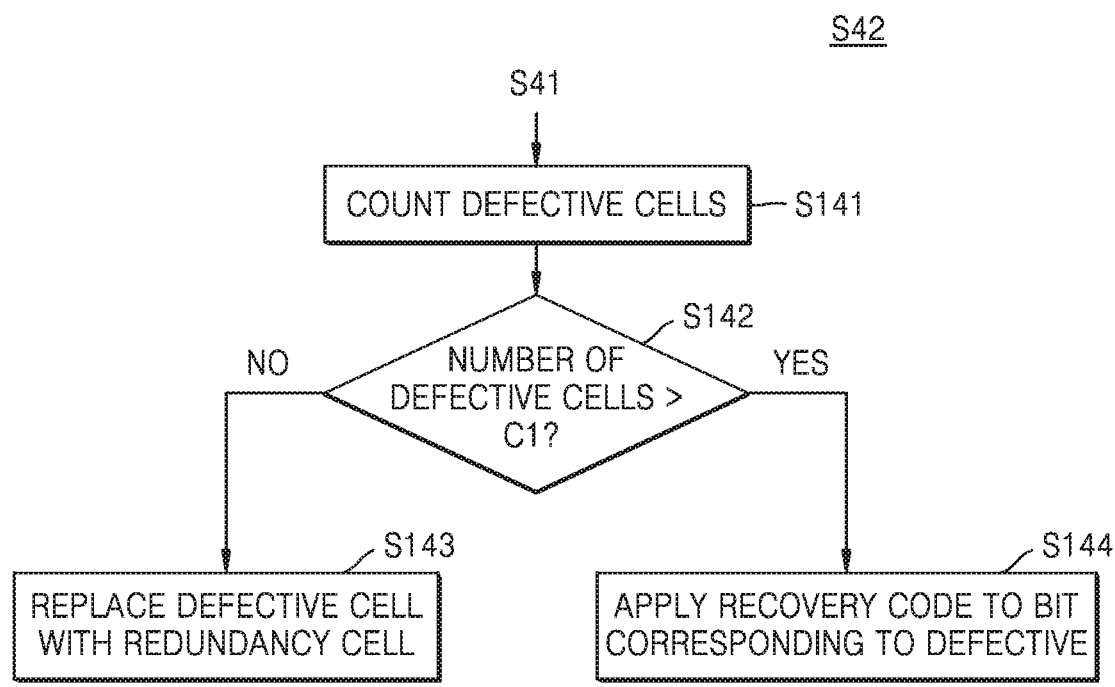
FIG. 4 is a flowchart of an operation of repairing a defective cell in a method of operating a storage device according to an embodiment of inventive concepts.

FIG. 4 is a flowchart of an operation of repairing a defective cell in a method of operating a storage device according to an embodiment of inventive concepts.

As described above, either hardware or software repair may be performed in the operation of repairing a defective cell (e.g., operation S42 in FIG. 3).

Referring to FIG. 4, the storage device 100 may count defective cells in operation S141 and may determine whether the number of defective cells exceeds a predefined and/or specific value C1 in operation S42.

When the number of defective cells is less than or equal to the predefined and/or specific value C1, the storage device 100 may repair the defective cells with hardware by replacing the defective cells with redundancy cells, rerouting internal circuitry. For example, the VM 110 may include at least one fuse and/or at least one antifuse. Replacing defective cells with redundancy cells may include converting at least one fuse in a normally closed state to an open state and/or converting normally at least one antifuse in a normally open state to a closed state, by creating a sufficiently high voltage between first nodes and second nodes of the fuses and/or antifuses. Converting a fuse to an open state or converting an antifuse to a closed state may reroute the row address X-ADDR or column address Y-ADDR from the memory block MBLK to the redundancy block RBLK.

When the number of defective cells is exceeds the predefined and/or specific value C1, the storage device 100 may apply recovery code to a bit corresponding to each defective cell in operation S144. For example, when read data includes a bit corresponding to a defective cell, the storage device 100 may repair the defective cell with software by applying recovery code to the read data.

As described above with reference to FIG. 4, the storage device 100 may selectively use a repair method based on a predefined and/or specific condition. However, various repair algorithms may be used when a repair method is used. For example, a defective cell may be repaired either with hardware or software according to a test condition at the time of detection of the defective cell or a fail type of the defective cell (e.g., what type of fail has occurred).

Figure 5:
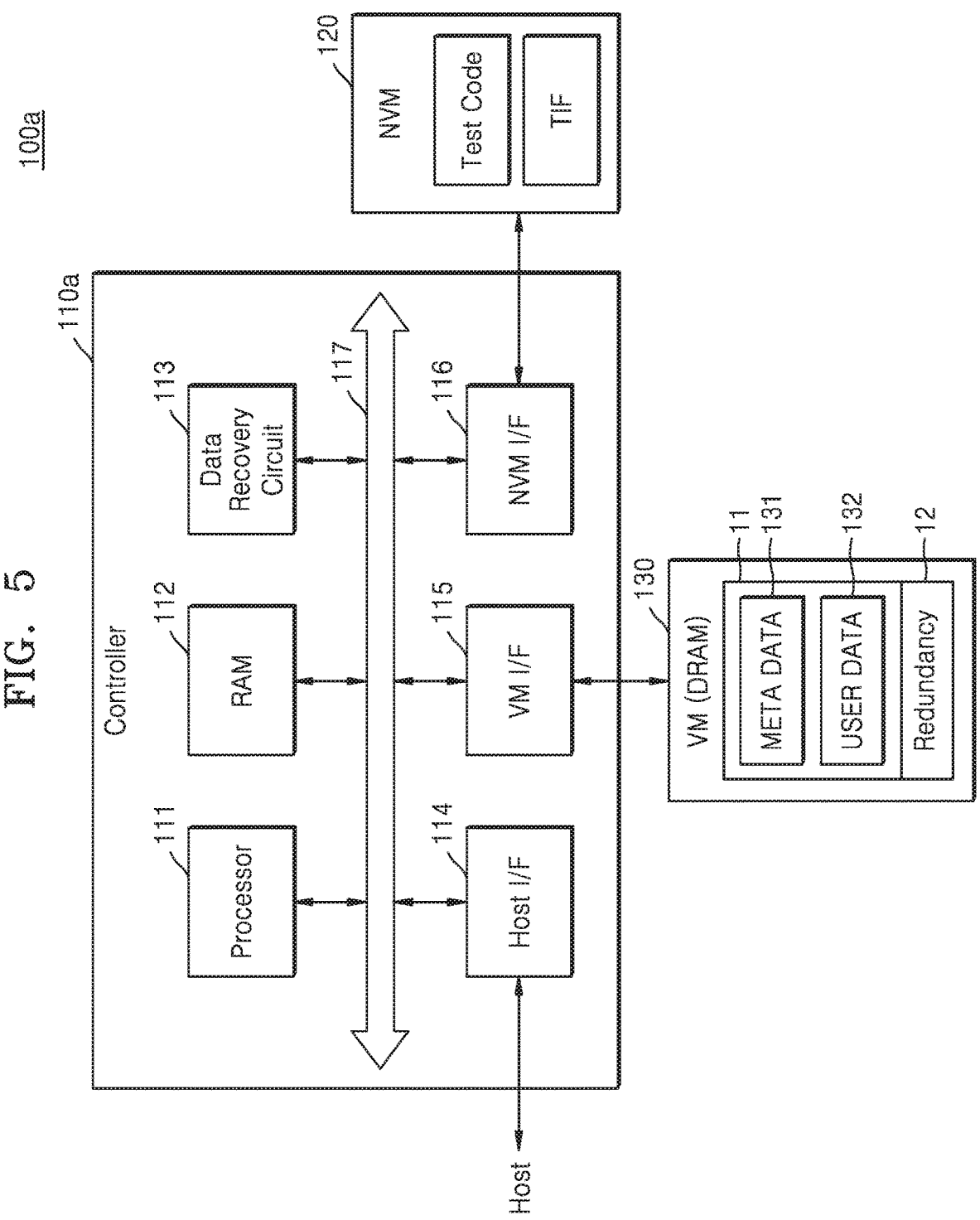
FIG. 5 is a block diagram of a storage device according to an embodiment of inventive concepts.

FIG. 5 is a block diagram of a storage device according to an embodiment of inventive concepts.

Referring to FIG. 5, a storage device 100a may include a controller 110a, the NVM 120, and the VM 130. The controller 110a may include a processor 111, RAM 112, a data recovery circuit 113, a host interface (I/F) 114, a VM I/F 115, and an NVM I/F 116, which may communicate with one another via a bus 117. The controller 110a may also include other elements such as a direct memory access (DMA) manager and the like. In other embodiments, the VM I/F 115 and the NVM I/F 116 may be integrated into one memory interface.

The host I/F 114 may provide an interface between the host 200 and the controller 110a. The host 200 and the controller 110 may be connected with each other using at least one interface selected from among various standard interfaces, such as USB, eMMC, MMC, PCI-E, ATA, SATA, e-SATA, parallel ATA (PATA), SCSI, SAS, enhanced small disk interface (ESDI), integrated drive electronics (IDE), IEEE 1394, and a card interface.

The processor 111 may execute machine-readable instructions to control all operations of the controller 110a. The processor 111 may include a CPU, a microprocessor, and/or the like. The processor 111 may execute firmware or software for driving the controller 110a. The firmware may be loaded to the RAM 112, and the processor 111 may execute instructions stored on the firmware. The firmware may include program code, e.g., test code including an algorithm involved in a test of the VM 130. The firmware may also include a flash translation layer (FTL).

The RAM 112 may operate according to the control of the processor 111 and may be used as working memory, buffer memory, cache memory, or the like. Software or firmware for controlling the controller 110a may be loaded to the RAM 112. The RAM 112 may be implemented as, or may include, volatile memory such as DRAM or SRAM or resistive memory such as ReRAM, PRAM, or MRAM.

The VM I/F 115 provides an interface between the controller 110a and the VM 130. Data to be written to the NVM 120 or data read from the NVM 120 may be temporarily stored or buffered in the VM 130 via the VM I/F 115.

The NVM I/F 116 may provide an interface between the controller 110a and the NVM 120. For example, the controller 110a may transmit and receive data to and from the NVM 120 via the NVM I/F 116.

When there is an error in data read from the VM 130 or the NVM 120, the data recovery circuit 113 may recover the data. The data recovery circuit 113 may apply recovery code to data including a bit corresponding to a defective cell in the VM 130 as described above with reference to FIG. 2, thereby recovering the data. In an example embodiment, the data recovery circuit 113 may include an error checking and correction (ECC) engine and may perform ECC on data read from the NVM 120.

The NVM 120 may store write data from the host 200. The NVM 120 may also store the test code described above. The NVM 120 may also store the test information TIF of the VM 130.

The VM 130 may include or may be implemented as DRAM; however, inventive concepts are not limited thereto. The VM 130 may include a memory block 11. The memory block 11 is a region in which write data is stored according to a normal operation of the VM 130 and of which an address may be recognized by the controller 110a. The memory block 11 may include a metadata area 131 and a user data area 132. Metadata of the NVM 120 may be stored in the metadata area 131 and data to be written to or read from the NVM 120, e.g., user data, may be buffered in the user data area 132. The metadata area 131 and the user data area 132 may not be physically defined. For example, the metadata area 131 and the user data area 132 may be logically defined, and may be defined by an address allocated to each area. However, inventive concepts are not limited to the above description. Of areas that may be recognized by the controller 110a, an area in which metadata has been stored may be defined as the metadata area 131 and the other area may be defined as the user data area 132.

The VM 130 may also include a redundancy block 12. The redundancy block 12 is a region which may replace a portion of the memory block 11 under a particular condition. When hardware repair is performed on a defective cell in the VM 130, the defective cell may be replaced with a redundancy cell in the redundancy block 12.

Figure 6:
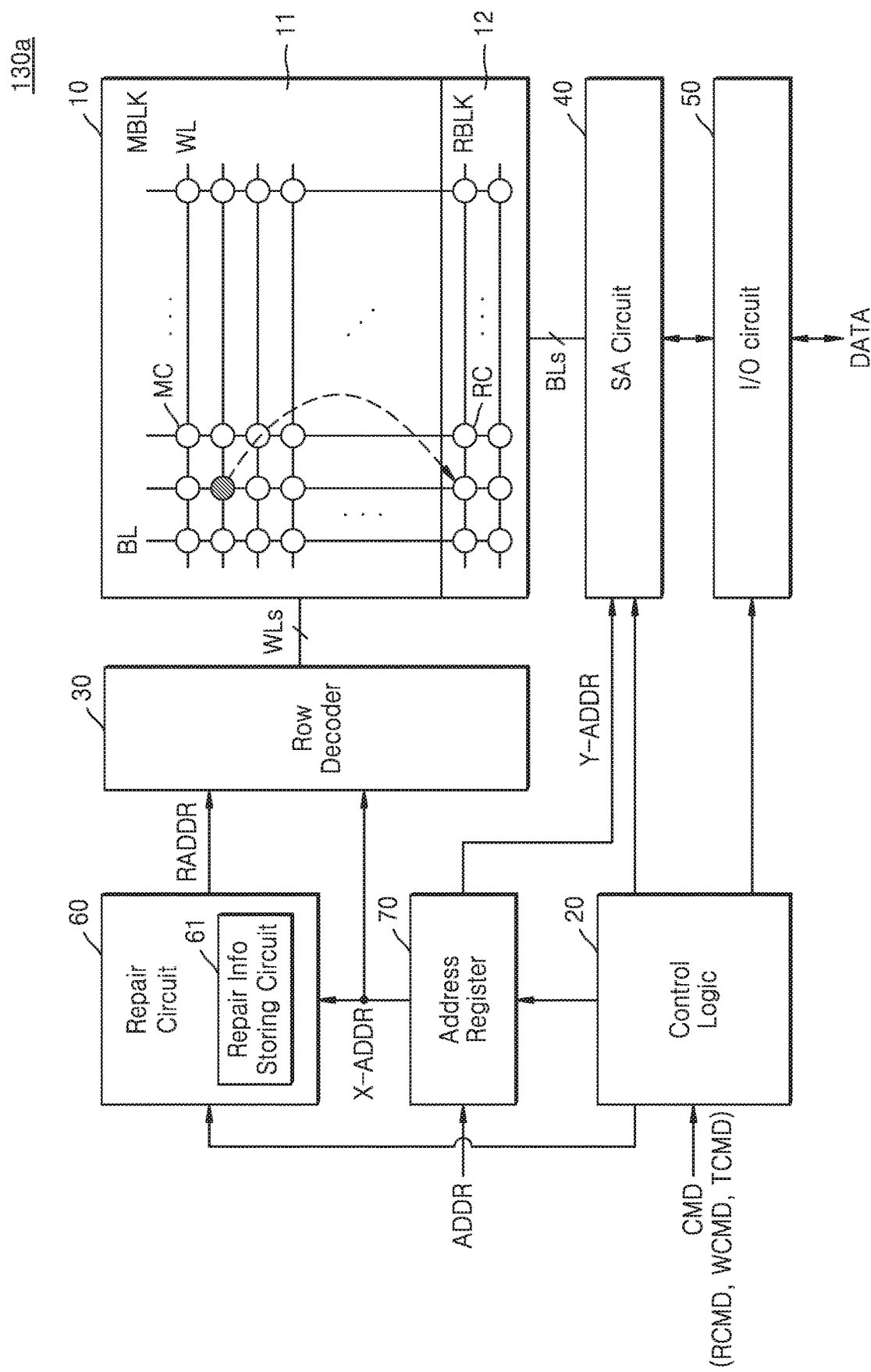
FIG. 6 is a circuit diagram of a volatile memory according to an embodiment of inventive concepts.

FIG. 6 is a circuit diagram of a VM according to an embodiment of inventive concepts.

Referring to FIG. 6, a VM 130a may include a memory cell array 10, a control logic 20, a row decoder 30, a sense amplifier (SA) circuit 40, an input/output (I/O) circuit 50, a repair circuit 60, and an address register 70. The VM 130a may also include other elements used for data write and/or read operations.

The memory cell array 10 may include a plurality of memory cells MC connected to a plurality of bit lines (BLs) and to a plurality of word lines (WLs). The memory cell array 10 may include a memory block MBLK and a redundancy block RBLK. When some of the memory cells MC in the memory block MBLK are determined to be defective cells through a test of the memory cell array 10, the defective cells may be replaced by redundancy cells RC. When data is requested to be written to a defective cell, the data may be written to a redundancy cell RC which has replaced the defective cell; and when data is requested to be read from a defective cell, the data may be read from a redundancy cell RC which has replaced the defective cell.

The control logic 20 may control all of, or at least some of, the operations of the VM 130a. The control logic 20 may receive and decode a command CMD and internally generate a decoded command signal. For example, the control logic 20 may receive a write command WCMD, a read command RCMD, and a test command TCMD. The control logic 20 may control the VM 130a in response to the test command TCMD so that a test is performed on the memory cell array 10.

The address register 70 may temporarily store an address signal ADDR externally input thereto. Thereafter, the address register 70 may transmit a row address X-ADDR to the row decoder 30 and a column address Y-ADDR to the SA circuit 40. The address register 70 may also transmit the row address X-ADDR to the repair circuit 60.

The row decoder 30 may select a WL in response to the row address X-ADDR.

The SA circuit 40 may write data to or read data from the memory cell array 10. The SA circuit 40 may include a writing circuit and a reading circuit. The SA circuit 40 may be connected to a BL selected from among the BLs according to the column address Y-ADDR.

The I/O circuit 50 may transmit data read from the memory cell array 10 to outside of the VM 130a, e.g., the controller 110 (FIG. 1), or may transmit data received from the outside to the SA circuit 40.

The repair circuit 60 may replace a defective cell with a redundancy cell based on a test result of the memory cell array 10. The repair circuit 60 may store repair information, e.g., address mapping information of the redundancy cell corresponding to the defective cell, and may control the redundancy cell to be accessed when there is an access request for the defective cell. For this operation, the repair circuit 60 may include a repair information storing circuit 61. The repair information storing circuit 61 may be implemented as or may include one time programmable (OTP) memory. The OTP memory may include at least one fuse or at least one antifuse. The replacement may include a rerouting of internal circuitry of the VM 110. The rerouting may include blowing fuses and/or antifuses included in the VM 110.

When the row address X-ADDR provided by the address register 70 corresponds to the mapping information stored in the repair information storing circuit 61, the address register 70 may provide an address of the redundancy cell, e.g., a replacement address RADDR corresponding to the row address X-ADDR for the row decoder 30. The row decoder 30 may select a WL corresponding to the replacement address RADDR. Consequently, the defective cell may be repaired with hardware. For example, the row address X-ADDR may be compared with the mapping information stored in the repair information storing circuit 61, and the row decoder 30 may select a word line WL corresponding to the replacement address RADDR. Inventive concepts are not limited to repairing or replacing a cell. For example, if testing determines a plurality of cells along a row are defective, then the entire row corresponding to the row of the plurality of cells may be repaired, replaced, and/or rerouted. For example, if testing determines a plurality of cells along a column are defective, then the entire column corresponding to the column of the plurality of cells may be repaired, replaced, and/or rerouted.

Although a row region including the defective cell is replaced with a row region in the redundancy block 12 by replacing the WL including the defective cell with another WL in the embodiments illustrated in FIG. 6, inventive concepts are not limited thereto. A defective cell may be replaced with a redundancy cell RC by replacing a BL including the defective cell with another BL so that a column region including the defective cell is replaced with a column region in the redundancy block 12 or by replacing both WL and BL which include the defective cell.

Figure 7:
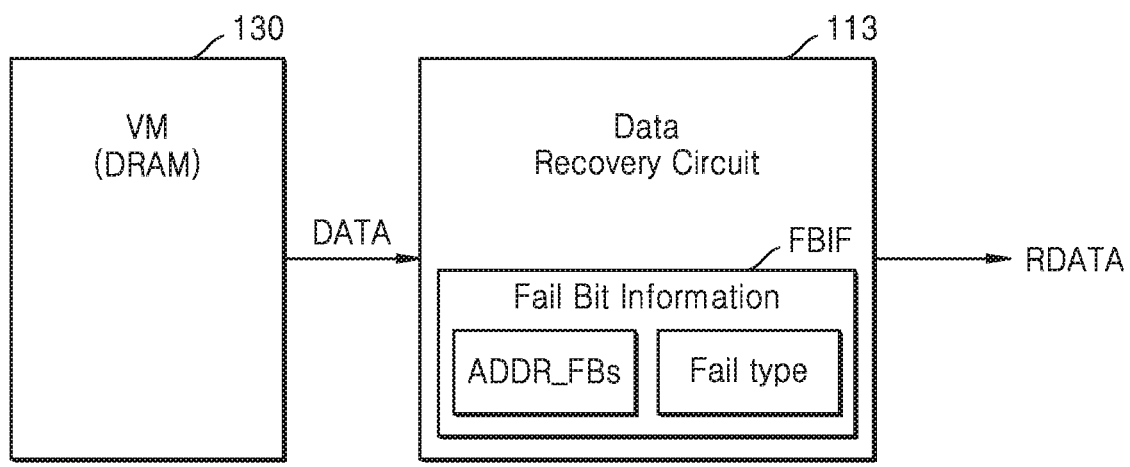
FIG. 7 is a diagram illustrating that a defective cell is repaired with software in a storage device according to an embodiment of inventive concepts.

FIG. 7 is a diagram illustrating that a defective cell is repaired with software in a storage device according to an embodiment of inventive concepts.

Referring to FIG. 7, when data read from the VM 130 includes a bit corresponding to a defective cell, the data recovery circuit 113 may receive the read data and may determine whether an error has occurred in the read data. When it is determined that an error has occurred in the read data, the data recovery circuit 113 may apply recovery code to the read data based on fail bit information FBIF. The fail bit information FBIF may be one of the test results. The fail bit information FBIF may include an address ADDR_FB and a fail type of a defective cell, e.g., a test fail cell. For example, when the defective cell has a data inversion failure, the data recovery circuit 113 may invert a value of a bit corresponding to the defective cell among a plurality of bits in the read data. Consequently, the data recovery circuit 113 may recover data from errors.

Although the fail bit information FBIF is stored and used in the data recovery circuit 113 in the embodiments illustrated in FIG. 7, inventive concepts are not limited thereto. The fail bit information FRIT may be stored in the RAM 112 (FIG. 5). The fail bit information FBIF of a plurality of fail bits may be stored in the RAM 112 and the data recovery circuit 113 may access the RAM 112 to read the fail bit information FBIF of a wanted fail bit from the RAM 112 during a data recovery process. The fail bit information FBIF may be stored in the NVM 120 (FIG. 5) as a test result.

Figure 8A:
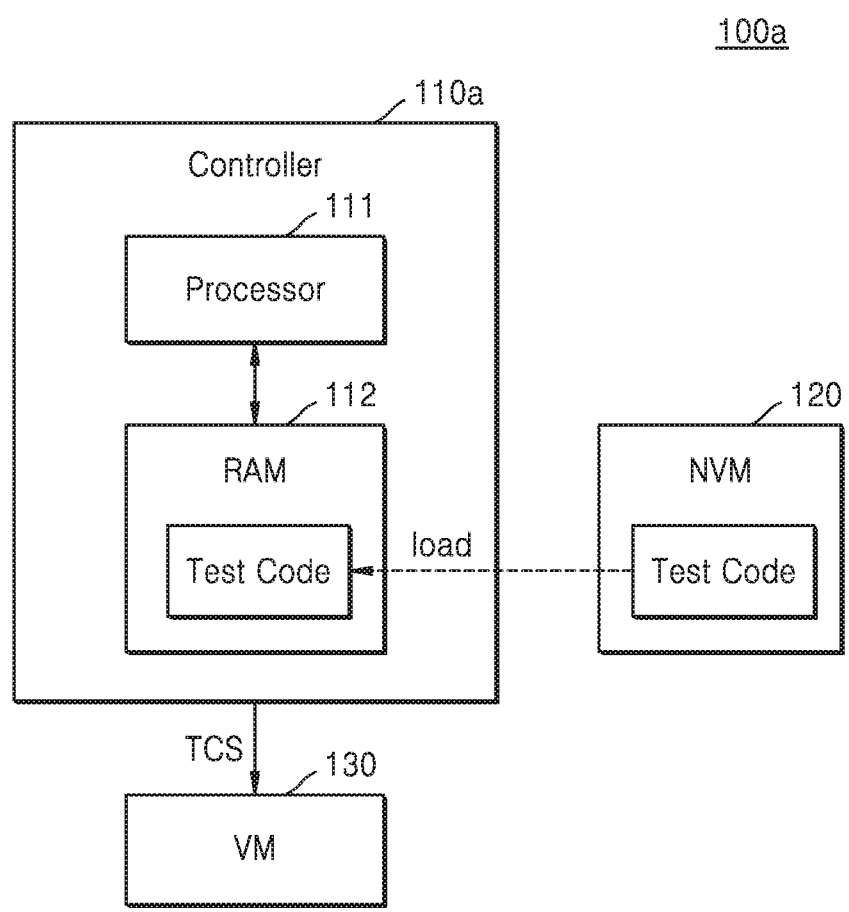
FIGS. 8A and 8B are schematic diagrams of operation of a storage device according to embodiments of inventive concepts.
Figure 8B:
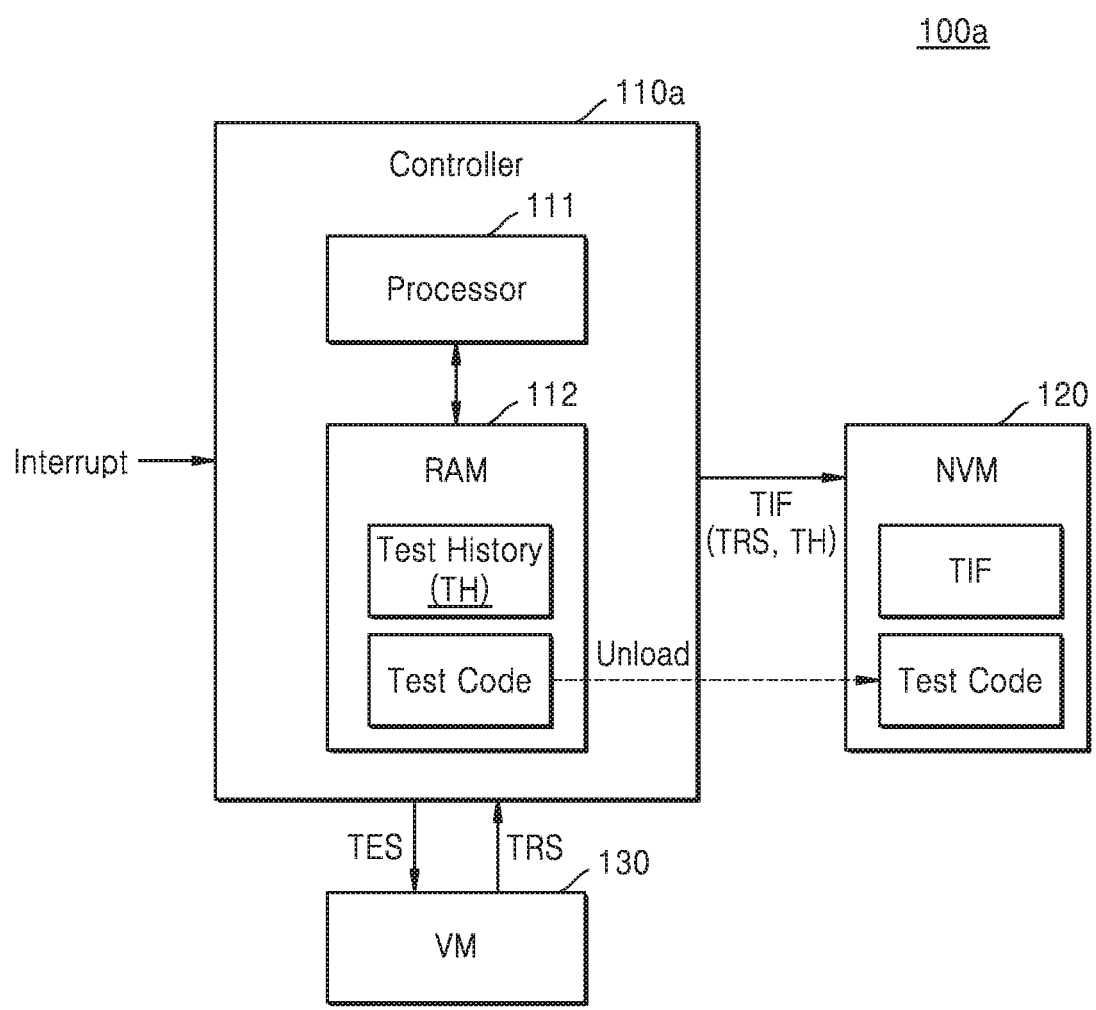

FIGS. 8A and 8B are schematic diagrams illustrating example operations of a storage device according to example embodiments of inventive concepts. FIG. 8A shows a procedure for performing a test on the VM 130 and FIG. 8B shows a procedure for ending the test of the VM 130.

Referring to FIG. 8A, a test algorithm for the VM 130 may be implemented by or may include firmware or software and test code including the test algorithm may be stored in the NVM 120.

When the storage device 100a enters an idle state, the controller 110a may read test code from the NVM 120. The test code may be loaded to the RAM 112 and the processor 111 may execute the test code. The operation of the controller 110a involved in the performing and ending of a test of the VM 130 may be carried out in the storage device 100a when the processor 111 executes the test code loaded to the RAM 112. The processor 111 may generate the test control signal TCS for instructing to perform a test and send the test control signal TCS to the VM 130. The test control signal TCS may include an address of a region on which the test will be performed, a test step (or a test type), and a test condition. The VM 130 may perform the test based on the test control signal TCS provided by the controller 110a.

Referring to FIG. 8B, when an interrupt occurs in the storage device 100a, the processor 111 may generate a test end signal TES and send the test end signal TES to the VM 130. The VM 130 may end the test. The VM 130 may provide a test result TRS obtained from a test process for the controller 110a. The controller 110a may store the test information TIF in the NVM 120. The test information TIF may include a test history TH of the test process that has been performed until the occurrence of the interrupt. The test information TIF may also include the test result TRS.

The test code may be unloaded from the RAM 112. When the test code is changed during the test, the test code may be updated by storing a changed test code in the NVM 120.

Alternatively or additionally, the test code may be updated by a user. The test code may be updated by receiving changed test code from the host 200 (FIG. 1) as write data and storing it in the NVM 120.

As described above, the storage device 100a may store the test code implemented by firmware or software in the NVM 120 and may perform a test of the VM 130 at an idle time. Accordingly, the VM 130 may continuously perform a test and detect a defective cell in the stage of using the storage device 100a after the storage device 100a is mounted in an electronic system, as well as in the stage of packaging of the storage device 100a. Since the test code is stored in the NVM 120, the test code may be updated. Therefore, another or a new test algorithm may be applied to the storage device 100a and a defective cell may be repaired using the other or the new test algorithm even when an unexpected error occurs in the VM 130, which enables active response to data errors in the VM 130.

Figure 9:
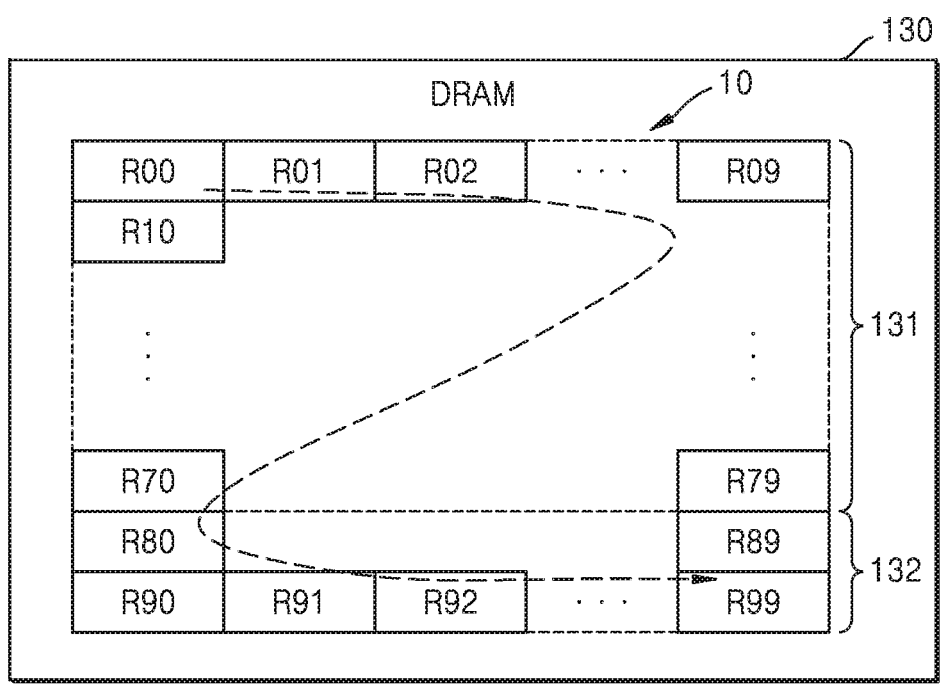
FIG. 9 is a block diagram of a memory cell array of a volatile memory according to an embodiment of inventive concepts.

FIG. 9 is a block diagram of a memory cell array of a VM according to an embodiment of inventive concepts.

Referring to FIG. 9, the memory cell array 10 of the VM 130 may be partitioned into a plurality of regions R00 through R99 based on a test unit on which a test is performed. Although the memory cell array 10 is partitioned into 100 regions in the embodiments illustrated in FIG. 9 for clarity of description, inventive concepts are not limited thereto. The number of regions may be determined based on the capacity of the memory cell array 10 and the test unit. For example, when the total capacity of (e.g., the size of data that can be stored in) the memory cell array 10 is two gigabytes (GB) and a test is performed in units of one megabyte (MB), the memory cell array 10 may be partitioned into 2000 regions. When an interrupt occurs, the storage device 100 (FIG. 1) may perform an operation corresponding to the interrupt after completing a test of a current unit. Accordingly, a test unit may be set to be small in comparison to the total capacity of the memory cell array 10, so that the test unit does not influence the performance of the storage device 100.

A test may be performed sequentially on the regions R00 through R99. When an interrupt occurs while a test is being performed on one of the regions R00 through R99 during an idle time of the storage device 100, the test may be ended after the test of the one region is completed. When or if the storage device 100 enters again enters idle state afterwards, a test may be performed from a region next to or adjacent to the one region on which the test has been performed at a previous idle time.

For example, when a test is performed sequentially from the region R00 at an idle time and an interrupt occurs while the test is being performed on the region R09, the test may be ended after the test of the region R09 is completed. Thereafter, a test may be performed from the region R10 to the region R99 at a next idle time.

Figure 10A:
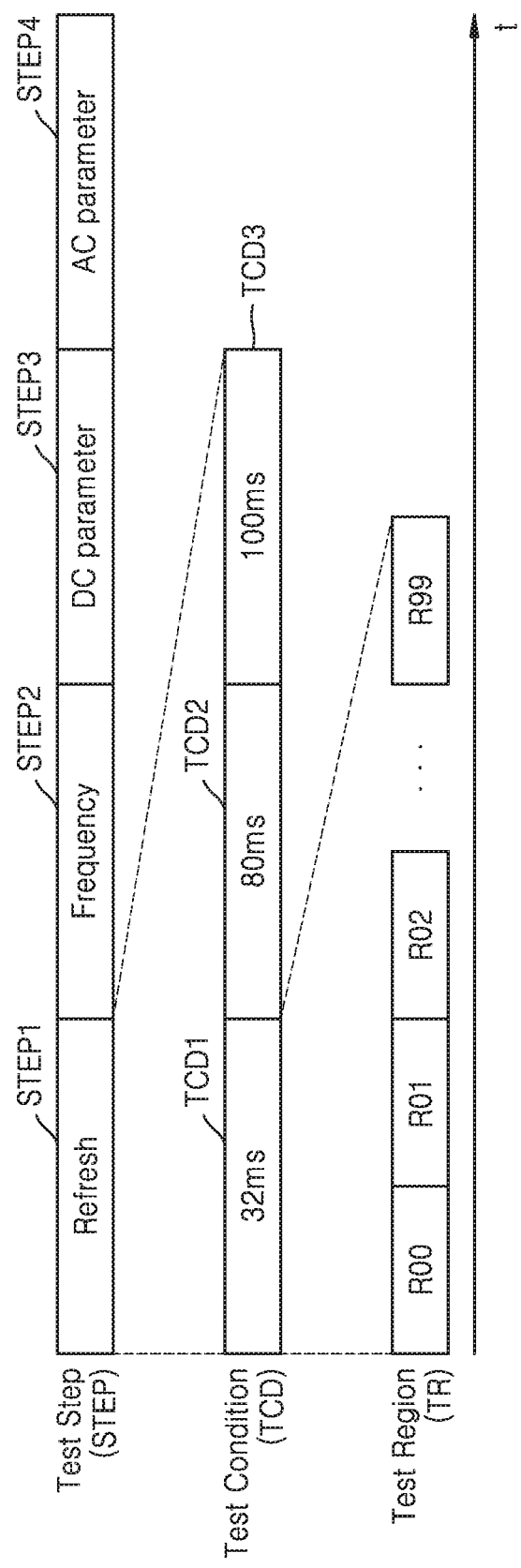
FIGS. 10A and 10B are diagrams of different test processes according to embodiments of inventive concepts.
Figure 10B:
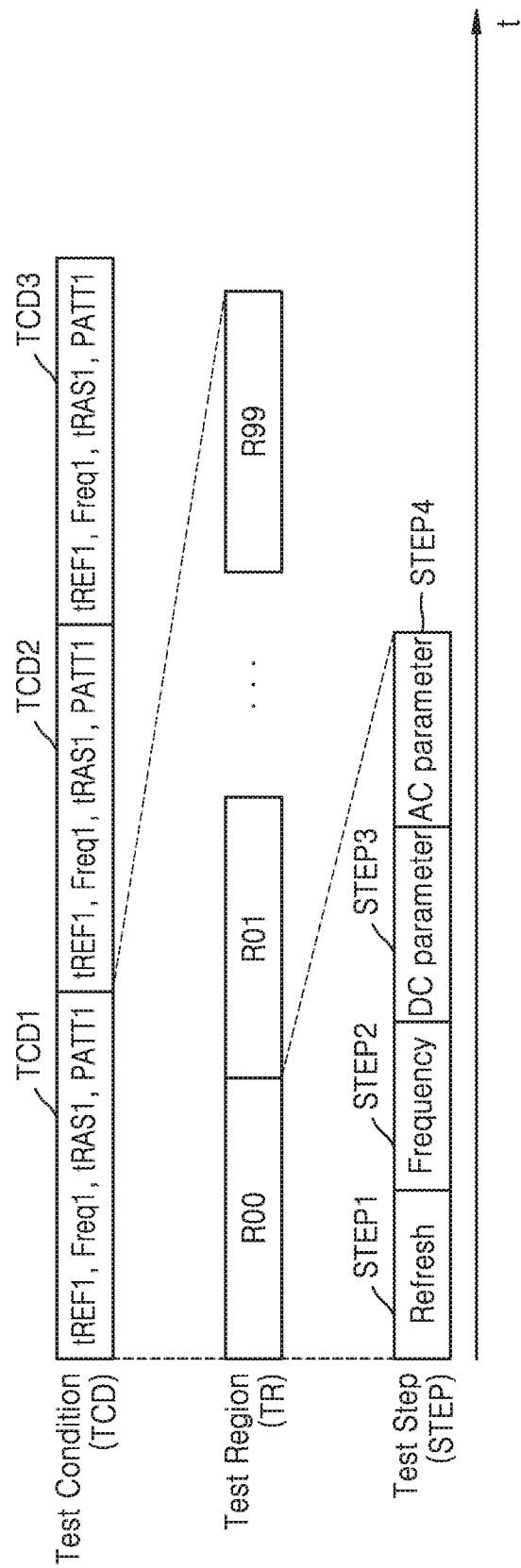

FIGS. 10A and 10B are diagrams of different test processes according to embodiments of inventive concepts.

Referring to FIGS. 10A and 10B, during the test of the VM 130 (FIG. 1), the test may be performed with respect to a plurality of test steps, e.g., test steps STEP1 through STEP4, a plurality of test conditions, e.g., test conditions TCD1 through TCD3, and a plurality of regions, e.g., regions R00 through R99.

Referring to FIG. 10A, the test steps STEP1 through STEP4 may be performed and the test conditions TCD1 through TCD3 may sequentially apply at each of the test steps STEP1 through STEP4. The test may be performed on the regions R00 through R99 of the VM 130 under one of the test conditions TCD1 through TCD3. For example, when the first test step STEP1, e.g., a refresh test is performed, as shown in FIG. 10A; the refresh test may be performed on the regions R00 through R99 based on the first condition TCD1, e.g., a refresh time of 32 ms, and then the refresh test may be performed on the regions R00 through R99 multiple times respectively based on the second condition TCD2, e.g., a refresh time of 80 ms, and the third condition TCD3, e.g., a refresh time of 100 ms. After the first test step STEP1 is completed, the second test step STEP2 may be performed on the regions R00 through R99 multiple times based on a plurality of test conditions corresponding to the second test step STEP2.

Referring to FIG. 10B, a test may be performed multiple times based on a plurality of the test conditions, e.g., test conditions TCD1 through TCD3, and a plurality regions, e.g., regions R00 through R99, may be sequentially tested under each test condition. When a test is performed on each of the plurality regions, e.g., regions R00 through R99, a plurality of test steps, e.g., test conditions STEP1 through STEP4, may be performed.

The test processes for the VM 130 have been described with reference to FIGS. 10A and 10B. However, inventive concepts are not limited to these test processes, and a test process may be changed to improve the time taken for a test, test efficiency, test coverage, and/or other aspects of the test process.

The test steps and the test conditions according to inventive concepts are not limited to those illustrated in FIGS.

10A and 10B, and one of skill in the art may modify test steps and/or test conditions. Various kinds of test steps and conditions may be used when a test is performed.

Figure 11A:
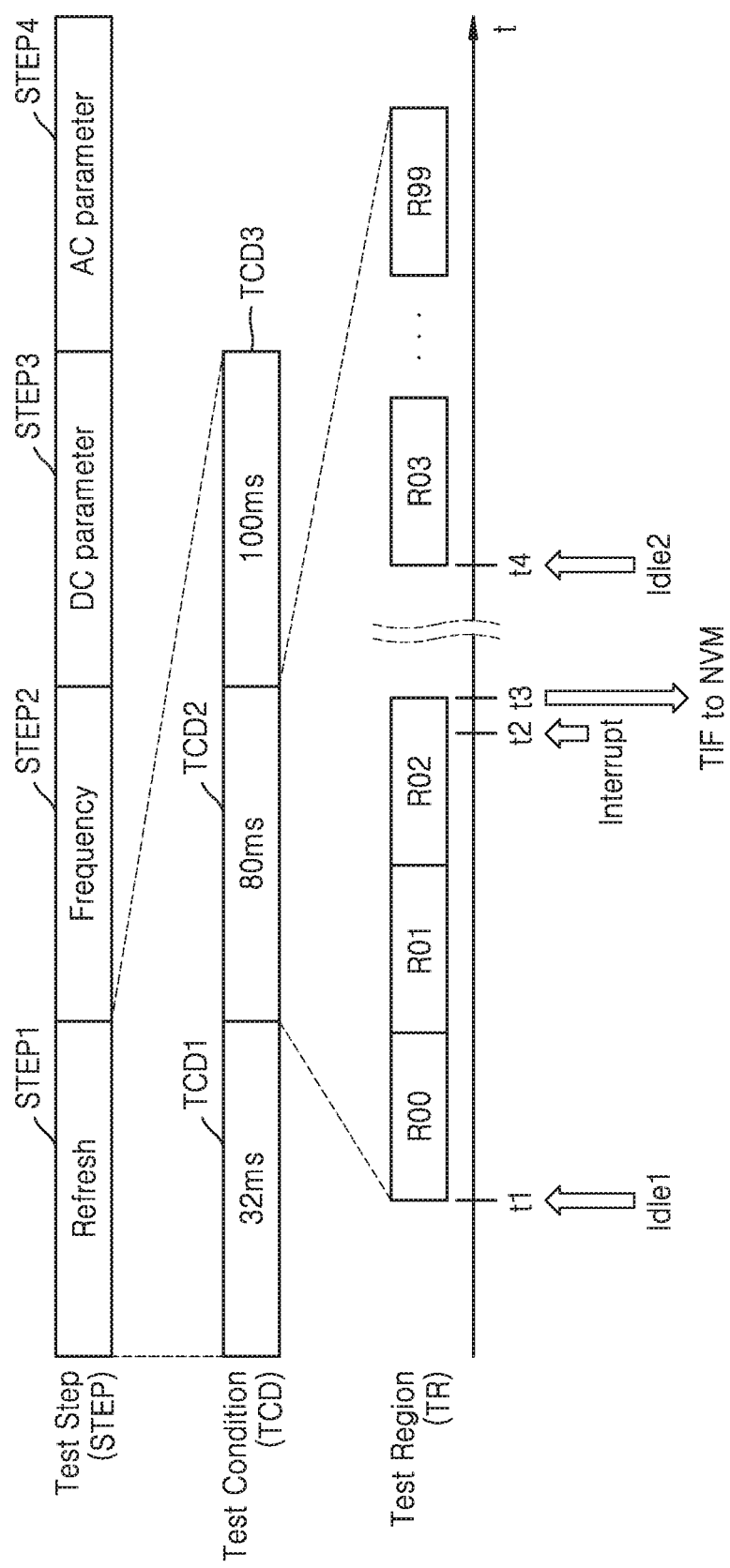
FIG. 11A is a diagram illustrating an operation of testing a volatile memory of a storage device according to an embodiment of inventive concepts.
Figure 11B:
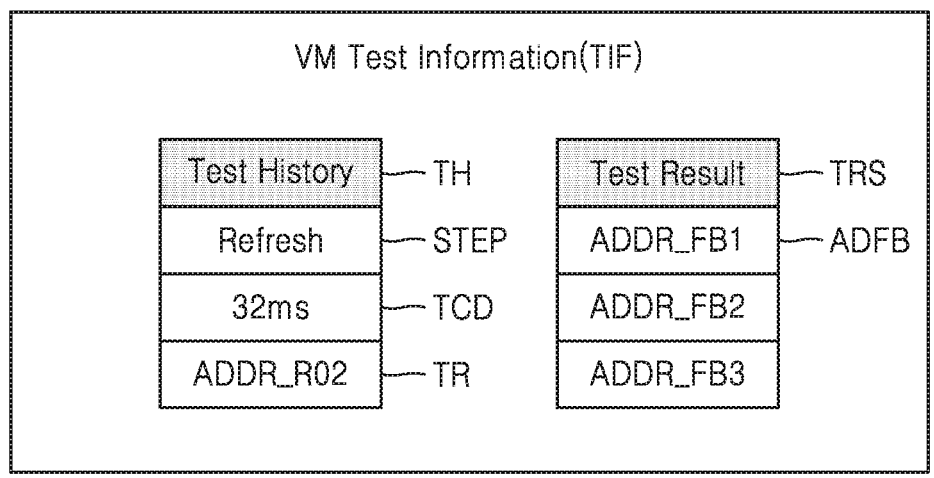
FIG. 11B is a diagram of a test history stored at the occurrence of an interrupt illustrated in FIG. 11A.

FIG. 11A is a diagram illustrating an operation of testing a VM of a storage device according to an embodiment of inventive concepts. FIG. 11B is a diagram of a test history stored at the occurrence of an interrupt illustrated in FIG. 11A. For convenience's sake in the description, FIG. 1 is also referred to.

A test may be performed on the VM 130 (FIG. 1) according to a test process illustrated in FIG. 11A. The test process illustrated in FIG. 11A is the same as that described with reference to FIG. 10A. Accordingly for clarity, descriptions of the same or similar elements thereof will be omitted.

When or if the storage device 100 enters a first idle state Idle1 at a time point t1, the controller 110 may check a previous test history and determine a test process. For example, the previous test history may be stored in the NVM 120. The controller 110 may read the previous test history from the NVM 120 and check a test process performed in a previous idle state. For example, the controller 110 may check that the first test step STEP1 has been performed on all of the regions R00 through R99 under the first test condition TCD1 before (e.g., during the previous idle state).

The controller 110 may determine a test process to be performed based on a previous test history. The controller 110 may determine that the first test step STEP1 is performed starting from the region R00 under the second test condition TCD2. Accordingly, a test may be performed sequentially from the region R00.

When an interrupt occurs at a time point t2 during the test of the region R02, the controller 110 may store the test information TIF about the test process performed until the occurrence of the interrupt in the NVM 120 after the test of the region R02 is completed. Since the first test step STEP1 has been performed on the region R02 under the second condition TCD2 at the time point t2 when the interrupt occurs, such test history of the test process may be stored in the NVM 120 as the test information TIF. A test result of the test process performed until the time point t2 may also be stored in the NVM 120 as the test information TIF.

Referring to FIG. 11B, the test information TIF may include the test history TH and the test result TRS. Test history, e.g., a test step STEP, a test condition TCD, and a test region TR, of a test process performed at the time of occurrence of an interrupt, e.g., at the time point t2, may be stored as the test history TH. Although information only about the test process performed at the time point t2 is illustrated as the test history TH in FIG. 11B, inventive concepts are not limited to the embodiments illustrated in FIG. 11B. Information about an entire test process that has been performed before may be included in the test history TH.

As shown in FIG. 11B, the test result TRS may include an address ADFB of a fail bit. Addresses of a plurality of fail bits detected according to the test process that has been performed until the time point t2 may be sent to the NVM 120 as the test result TRS.

Test process and test information have been described above with reference to FIGS. 10A through 11B, but inventive concepts are not limited to these examples. Test process and test information may be variously changed.

FIG. 12 is a flowchart of a method of operating a storage device according to an embodiment of inventive concepts. In detail, FIG. 12 illustrates a method of operating a storage device when an interrupt occurs after a test is performed on some of a plurality of regions of the VM 130 (FIG. 1).

Referring to FIG. 12, when the storage device 100 (FIG. 1) enters an idle state in operation S210, the storage device 100 or the controller 110 may check a previous test history of the VM 130 in operation S220. The controller 110 may determine a test region on which a test will be performed based on the previous test history in operation S230. The controller 110 may determine, as the test region, a region other than regions on which the test has been performed before among a plurality of regions of the VM 130 in operation S230.

The test may be performed sequentially on regions, on which the test has not been performed before, starting from the determined test region in operation S240. When an interrupt occurs during the test in operation S250, an address of each region on which the test has been performed until the occurrence of the interrupt may be stored in the NVM 120 in operation S251. Thereafter, the test is ended and the storage device 100 may perform a normal or nominal operation.

When an interrupt does not occur, the test may be continuously performed and whether a defective cell has been detected may be determined with respect to each of the regions on which the test has been performed in operation S260. When a defective cell has been detected, an address of the defective cell may be stored in operation S262. The address of the defective cell may be stored in the NVM 120. However, inventive concepts are not limited thereto and the address of the defective cell may be temporarily stored in the VM 130.

Thereafter, the storage device 100 may determine whether the test has been completed on all of the plurality of regions in operation S270. When the test has been completed, the storage device 100 may determine whether any defective cell detected during the test, that is, any defective cell of which an address has been stored exists in operation S280. For example, existence or non-existence of a defective cell may be determined based on the record stored in operation S262. When any defective cell of which an address has been stored exists, the storage device 100 may repair the detective cell in operation S290. As described above, the defective cell may be repaired with hardware and/or software.

When it is determined that the test has not been completed on all of the plurality of regions in operation S270, the test may be continued on regions that have not been tested. Accordingly, operations S240 through S270 may be repeated until the test is completed on all of the plurality of regions. As a result, the test may be performed on all of the plurality of regions.

Meanwhile, as described above with reference to FIG. 5, the VM 130 may include the metadata area 131 and the user data area 132. Since data in the metadata area 131 is valid while the storage device 100a is in an idle state, metadata stored in a region on which a test will be performed needs to be migrated to a free region before the test is performed on the metadata area 131.

A method of operating a storage device when a test is performed on the metadata area 131 will be described with reference to FIGS. 13A and 13B.

Figure 13A:
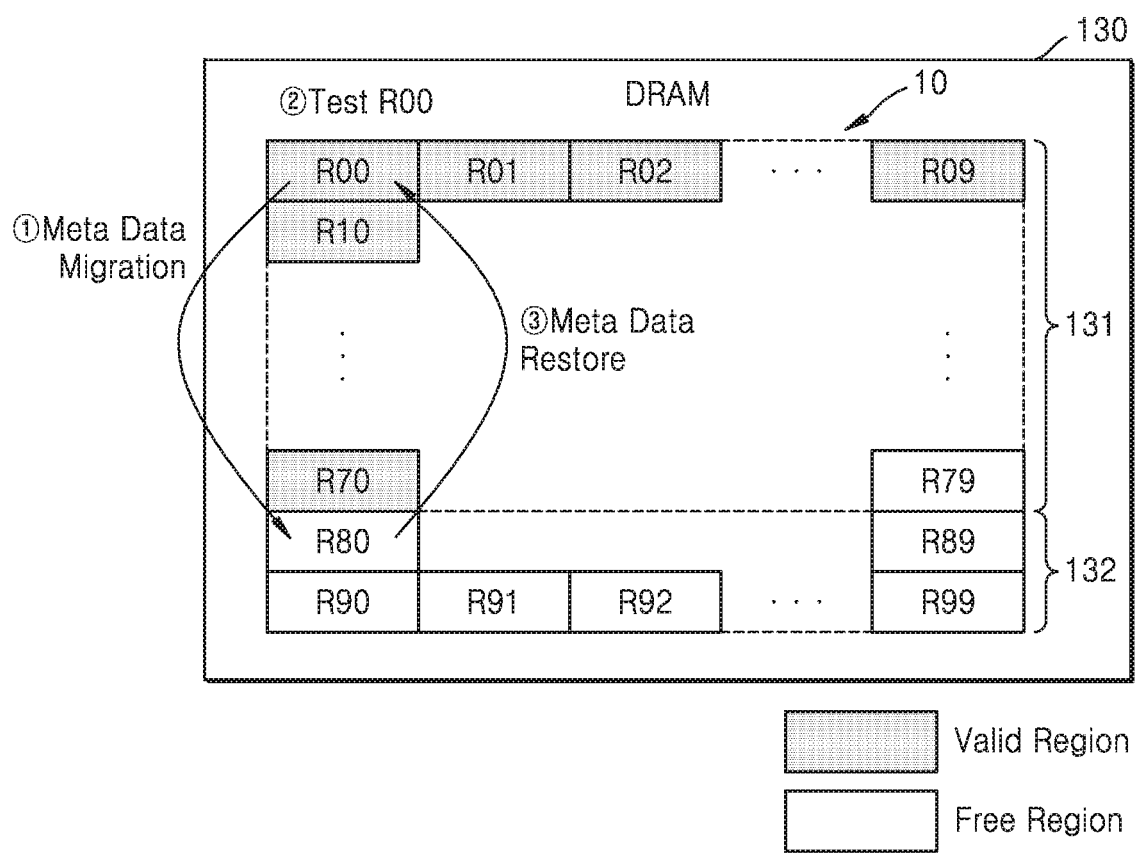
FIGS. 13A and 13B are diagrams of a data migration method performed when a test is performed on a valid region in a volatile memory of a storage device according to embodiments of inventive concepts.
Figure 13B:
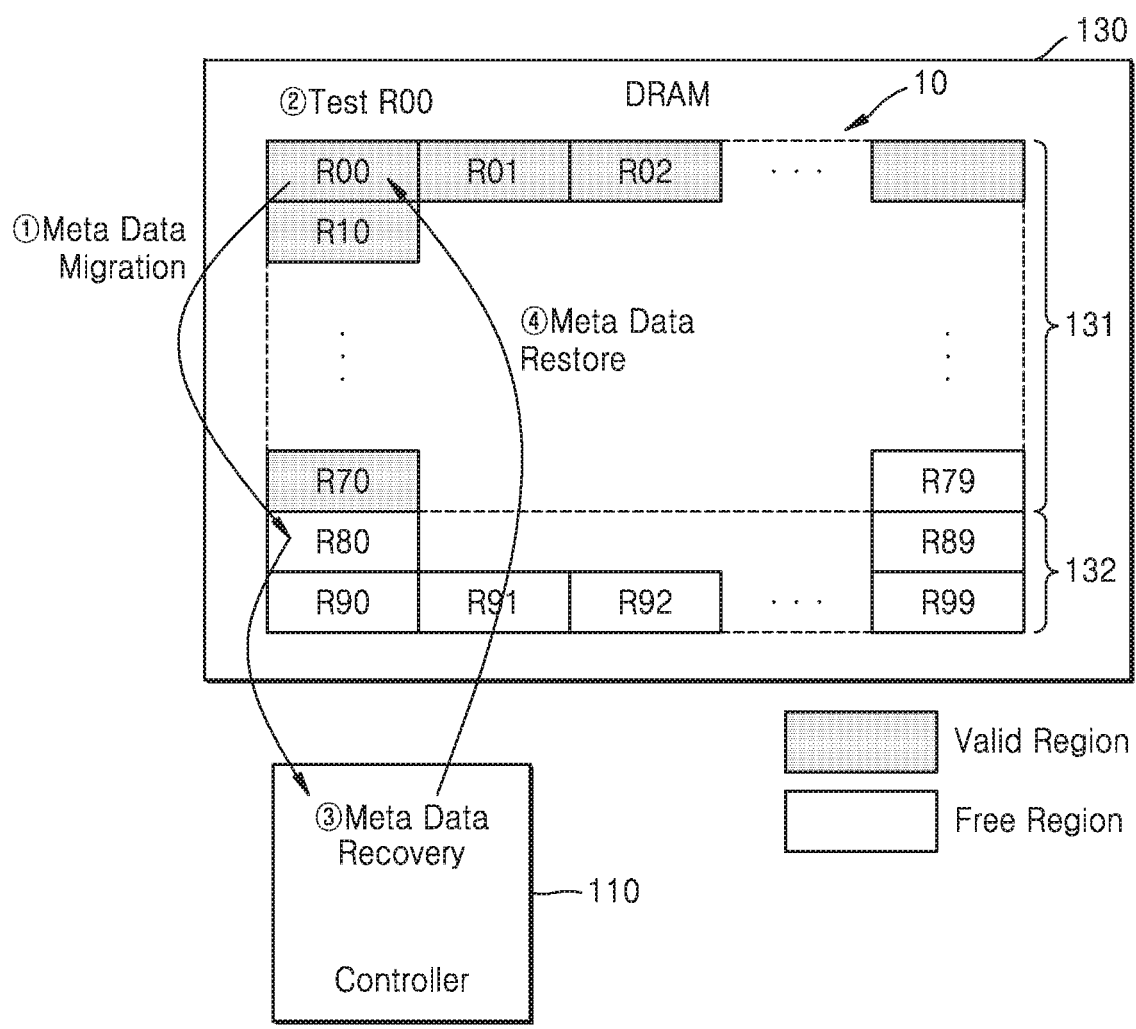

FIGS. 13A and 13B are diagrams of a data migration method performed when a test is performed on a valid region in a VM of a storage device according to embodiments of inventive concepts. In detail, FIG. 13A shows a case where a defective cell is not detected as a result of the test, and FIG. 13B shows a case where a defective cell is detected as a result of the test.

The VM 130 may include the metadata area 131 and the user data area 132. Metadata of the NVM 120 or data for the operation of the storage device 100 may be stored in the metadata area 131. The metadata area 131 and the user data area 132 may be partitioned into a plurality of regions (e.g., the regions R00 through R79 and the regions R80 through R99) based on a test unit. When the storage device 100 is in an idle state, data stored in the user data area 132 may be invalid and a plurality of regions, e.g., the regions R80 through R99, in the user data area 132 may be free regions. However, even when the storage device 100 is in the idle state, the metadata stored in the metadata area 131 may be valid and some of a plurality of regions, e.g., the regions R00 through R79, in the metadata area 131 may be valid regions. When a test is performed on the valid regions, data stored in the valid regions may be migrated to free regions.

As shown in FIG. 13A, when a test is performed on the region R00, (①) metadata stored in the region R00 may be migrated to one of the free regions, e.g., the region R80 and temporarily stored in the region R80, Thereafter, (②) the test is performed on the region R00. When a defective cell is not detected in the region R80, (③) the metadata temporarily stored in the region R80 may be restored in the region R00.

Referring to FIG. 13B, when a defective cell is detected in the region R00, (③) data recovery may be performed on data including a bit corresponding to the defective cell, e.g., metadata temporarily stored in the region R80 and (④) recovered metadata may be restored in the region R00. For example, the controller 110 may read the metadata temporarily stored in the region R80 and apply recovery code to the metadata, thereby recovering the metadata. Thereafter, the controller 110 may store the recovered metadata in the region R00.

In other example embodiments, when the defective cell is repaired with hardware, some bits in the recovered metadata, e.g., some bits including a bit corresponding to the defective cell, may be stored in redundancy cells.

Figure 14:
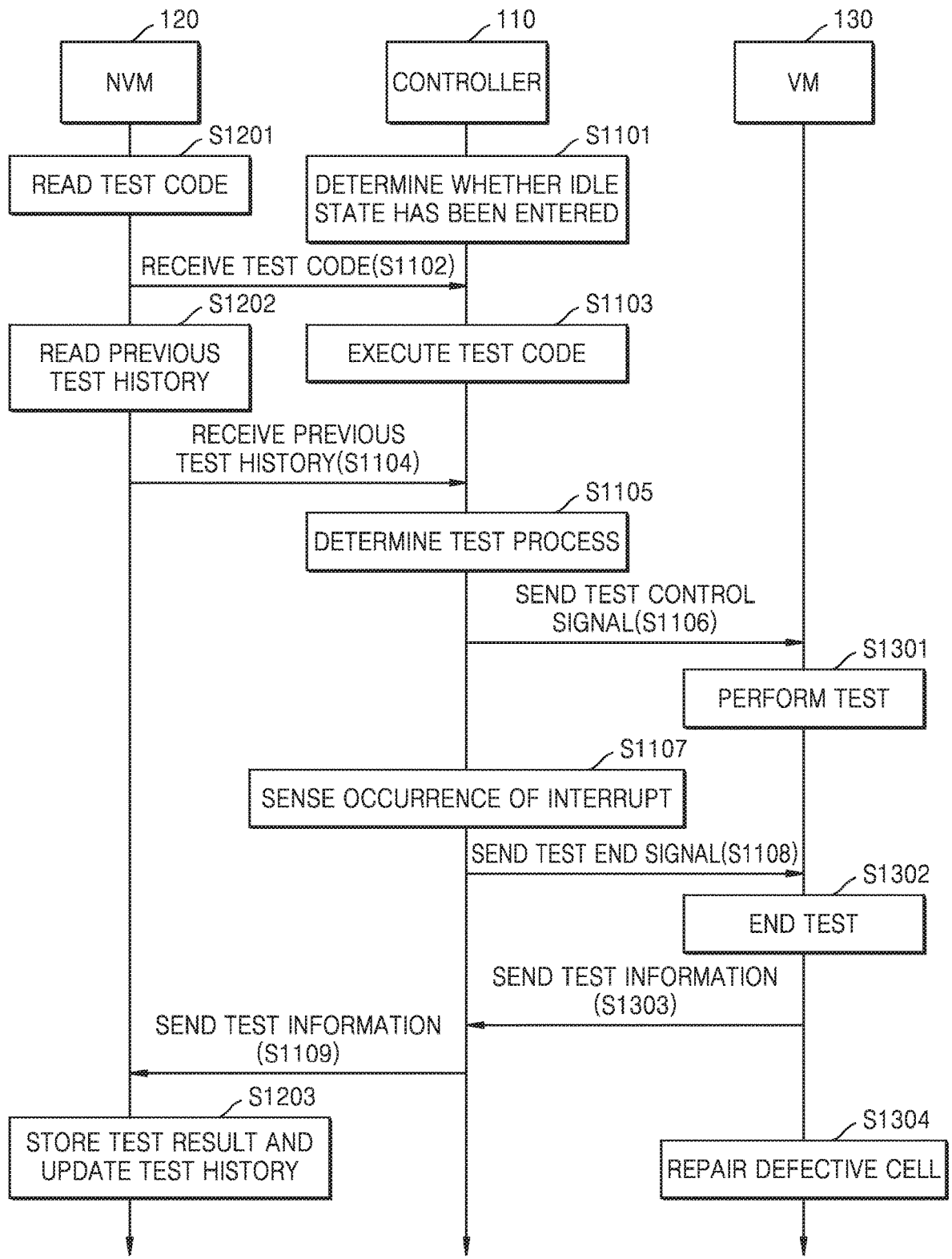
FIG. 14 is a flowchart of operation of elements of a storage device according to an embodiment of inventive concepts.

FIG. 14 is a flowchart of operation of elements of a storage device according to an embodiment of inventive concepts.

Referring to FIG. 14, the controller 110 may determine that the storage device 100 (FIG. 1) has entered an idle state in operation S1101. The NVM 120 may read test code in operation S1201 and may transmit the test code to the controller 110. The NVM 120 may read and transmit the test code at the request of the controller 110.

The controller 110 may receive the test code in operation S1102 and may execute the test code in operation S1103. As described above with reference to FIG. 5, the test code may be loaded to the RAM 112 (FIG. 5) and the processor 111 (FIG. 5) may execute the test code.

The NVM 120 may read a previous test history and transmit the read previous test history to the controller 110 in operation S1202. The controller 110 may receive the previous test history in operation S1104 and may determine a test process to be performed based on the previous test history in operation S1105. For example, the controller 110 may determine a test step, a test condition, and a test region. The controller 110 may send a test control signal indicating the test process to the VM 130 in operation S1106. The VM 130 may perform a test based on the test control signal in operation S1301.

An interrupt may occur in the storage device 100 during the test. The controller 110 may sense the occurrence of the interrupt in operation S1107 and may send a test end signal to the VM 130 in operation S1108. When the test is completed on a region that has been currently being tested, the VII 130 may end the test in operation S1302.

The VM 130 may send a test result to the controller 110 in operation S1303. The controller 110 may send test information including the test result and/or a test history to the NVM 120 in operation S1109. The NVM 120 may store the test result and may update the test history based on the test information in operation S1203.

When or if the storage device 100 enters another idle state, the operations described above may be repeated and the test of a plurality of regions of the VM 130 may be completed. Accordingly, when a detective cell is detected, the defective cell may be repaired and/or replaced. As shown in FIG. 14, the VM 130 may repair the defective cell with hardware in operation S1304. For example, the VM 130 may replace the defective cell with a redundancy cell. In other example embodiments, the detective cell may be repaired with software by the controller 110, as described above with reference to FIG. 7.

Figure 15:
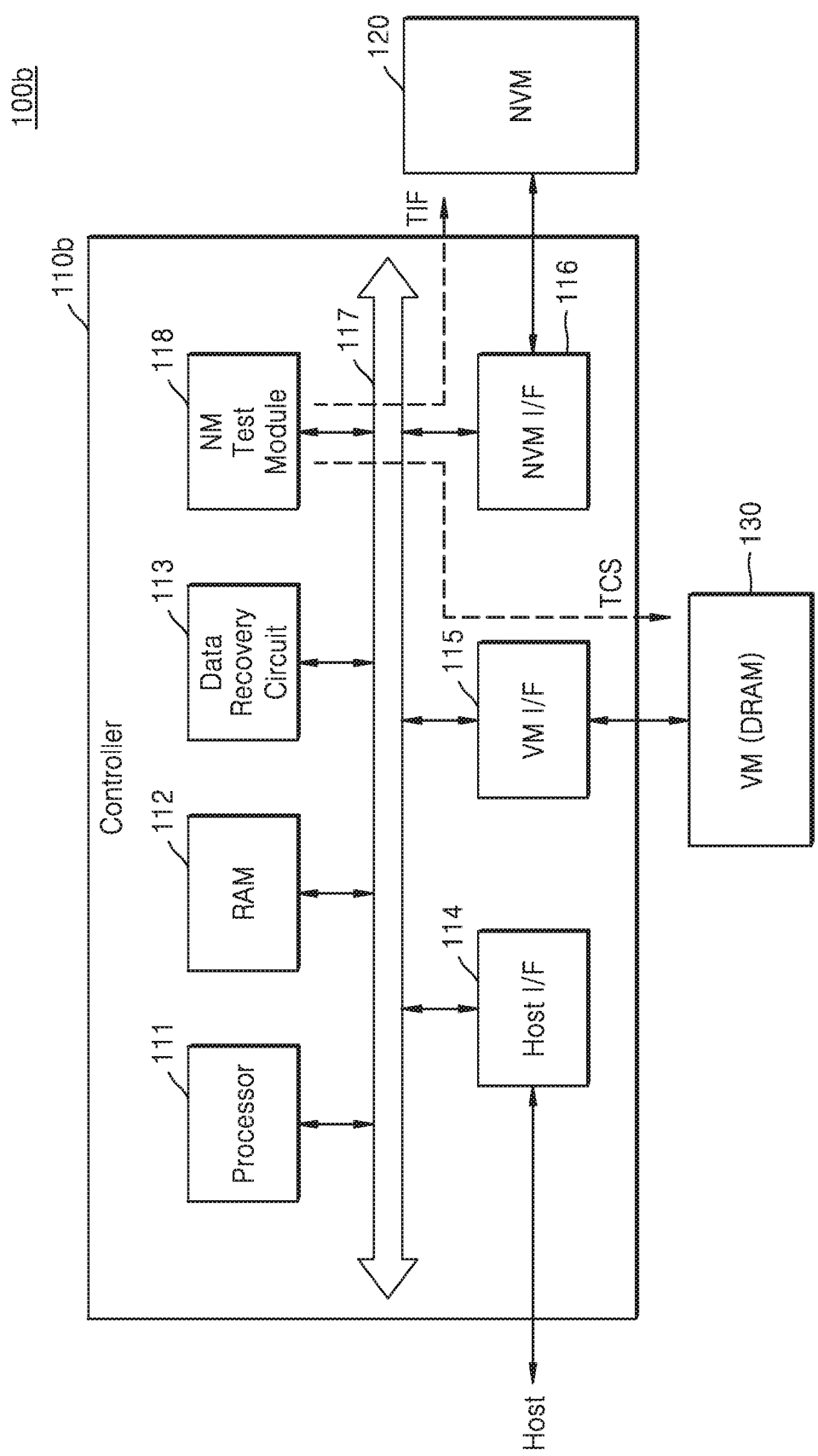
FIG. 15 is a block diagram of a storage device according to an embodiment of inventive concepts.

FIG. 15 is a block diagram of a storage device according to an embodiment of inventive concepts.

Referring to FIG. 15, a storage device 100b may include a controller 110b, the NVM 120, and the VM 130. The controller 110b may include the processor 111, the RAM 112, the data recovery circuit 113, the host I/F 114, the VM I/F 115, the NVM I/F 116, and a test module 118. These elements may communicate with one another via a bus 117. The storage device 100b may also include other elements.

The structure and operations of the controller 110b illustrated in FIG. 15 are similar to those of the controller 100a illustrated in FIG. 5. However, the controller 110b may further include the test module 118. Thus the test module 118 will be described.

The test module 118 may be implemented by hardware or a combination of hardware and software. The test module 118 may control the performing of a test of the VM 130 or the NVM 120. The test module 118 may be activated when the controller 110b enters an idle state. The test module 118 activated may generate the test control signal TCS and send the test control signal TCS to the VM 130. The VM 130 may perform a test based on the test control signal TCS received from the test module 118. Since the test procedure of the VM 130 has been described above in detail, the description thereof will be omitted.

As described above, the storage device 100b may include a functional block, e.g., the test module 118, dedicated for the test of the VM 130 or the NVM 120 in the controller 110b. The test module 118 may control the VM 130 or the NVM 120 to perform a test without causing the performance of the storage device 100b to significantly decrease.

Figure 16:
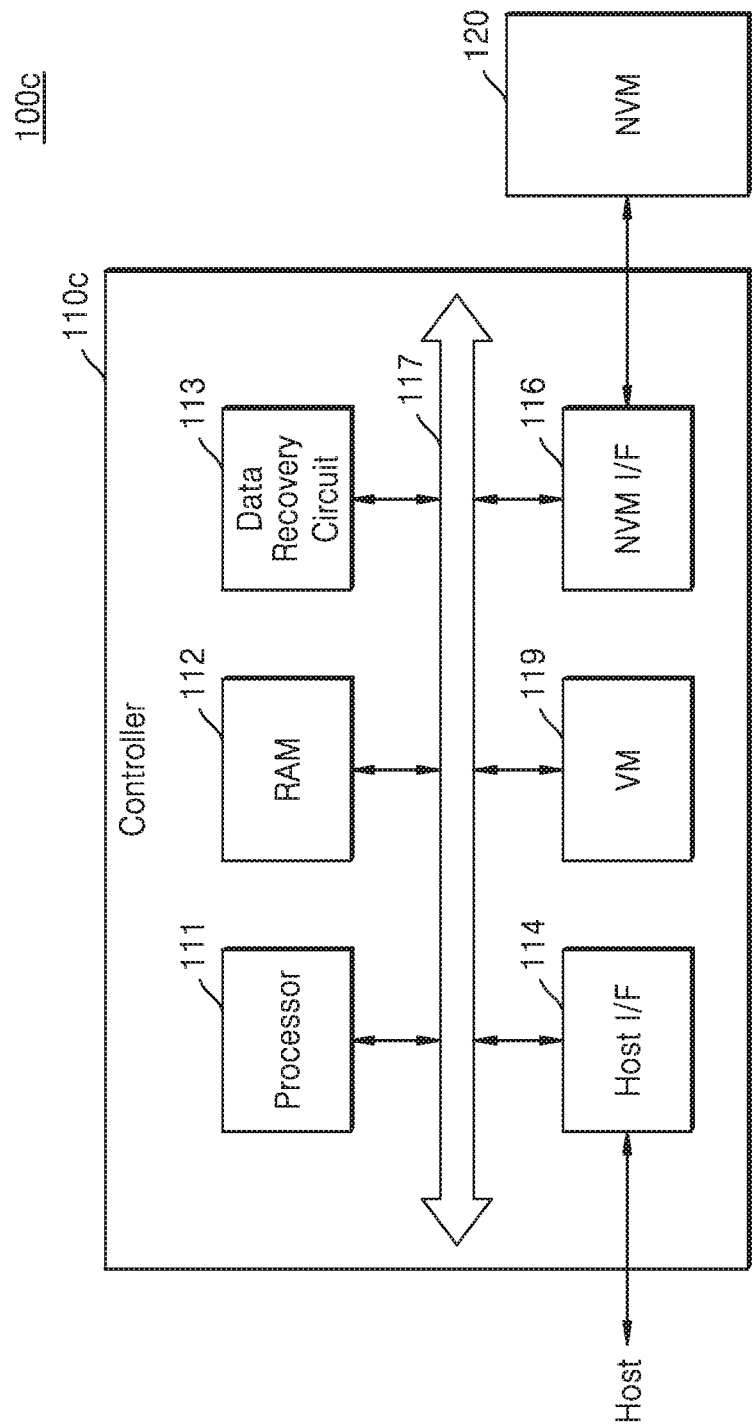
FIG. 16 is a block diagram of a storage device according to an embodiment of inventive concepts.

FIG. 16 is a block diagram of a storage device according to an embodiment of inventive concepts.

Referring to FIG. 16, a storage device 100c may include a controller 110c and the NVM 120. The controller 110c may include the processor 111, the RAM 112, the data recovery circuit 113, the host I/F 114, a \VM 119, and the NVM I/F 116. These elements may communicate with one another via the bus 117. The controller 110c may also include other elements.

The VM 119 included in the controller 110c may act as a buffer of the storage device 100c. The VM 119 may buffer write data and read data for the NVM 120. The VM 119 may also store metadata of the NVM 120. When or if the storage device 100c enters an idle state, a test for detecting a detective cell may be performed on the VM 119. A testing method and a defective cell repairing method are similar to those described above with reference to various embodiments. Thus redundant descriptions thereof will be omitted.

Figure 17:
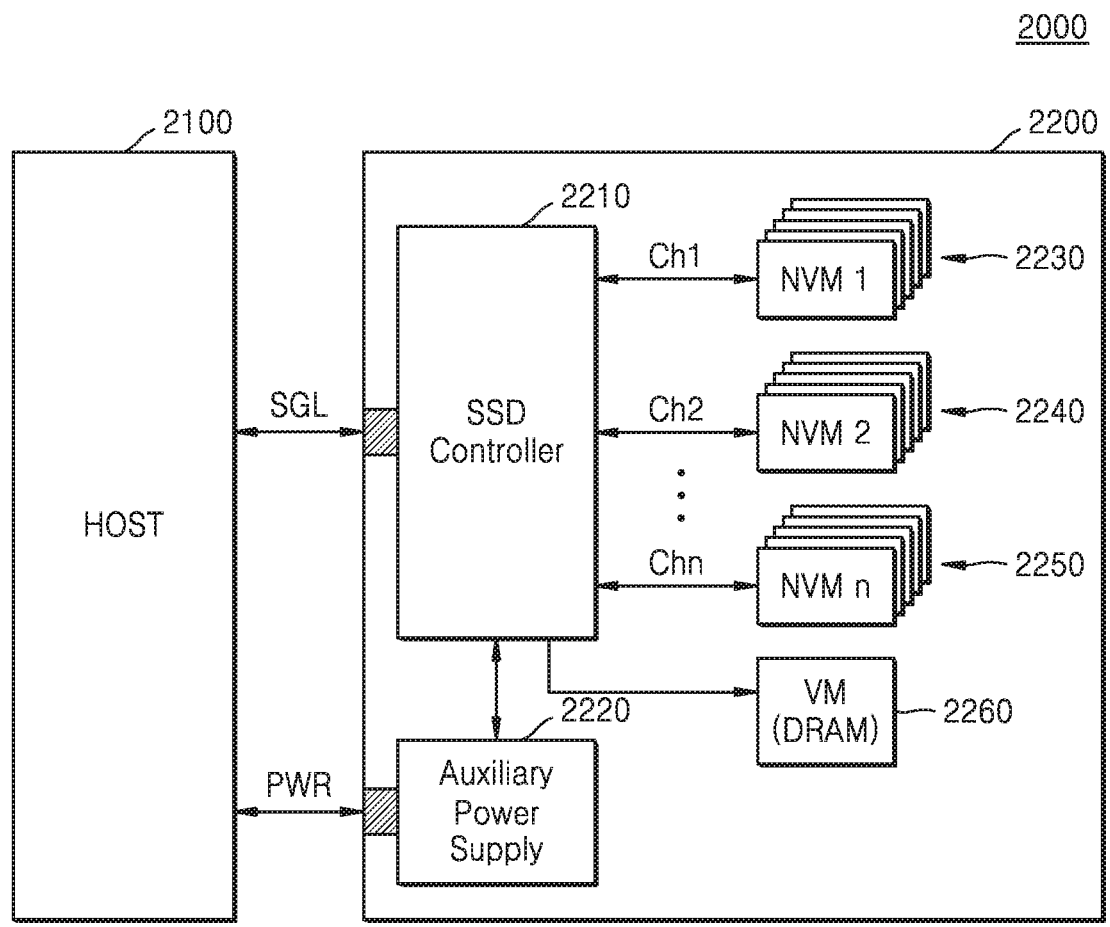
FIG. 17 is a block diagram of a solid state drive (SSD) system according to an embodiment of inventive concepts.

FIG. 17 is a block diagram of an SSD system according to an embodiment of inventive concepts.

Referring to FIG. 17, an SSD system 2000 may include a host 2100 and an SSD 2200. The SSD 2200 transmits and receives signals to and from the host 2100 via a signal connector and receives power via a power connector. The SSD 2200 may include an SSD controller 2210, an auxiliary power supply 2220, and a plurality of memory devices 2230, 2240, and 2250, and a buffer 2260.

The SSD controller 2210 may control all operations of the SSD 2200. The memory devices 2230, 2240, and 2250 may be NVM devices. At least one memory device among a plurality of the memory devices 2230, 2240, and 2250 may include a 3D flash memory cell array.

The buffer 2260 may buffer data stored in the memory devices 2230, 2240, and 2250. The buffer 2260 may also store metadata of the memory devices 2230, 2240, and 2250. The buffer 2260 may be a VM device. For example, the buffer 2260 may be implemented as DRAM.

The storage device 100 (FIG. 1), 100a (FIG. 5), 100b (FIG. 17), or 100c (FIG. 18) according to embodiments of inventive concepts may be applied to the SSD 2200. Accordingly, when the SSD 2200 is in an idle state, the SSD 2200 may detect and repair a defective cell.

The SSD controller 2210 may determine an operational state of the SSD 2200 based on a communication state between the host 2100 and the SSD 2200. For example, when communication is not performed between the host 2100 and the SSD 2200, e.g., there is no access request received from the host 2100, for a predetermined or specific period, it may be determined that the SSD 2200 has entered an idle state. When the SSD 2200 enters the idle state, the SSD controller 2210 may control the buffer 2260 to perform a test for detecting a defective cell during an idle time. A test algorithm may be implemented by firmware or software and may be stored in one of the memory devices 2230, 2240, and 2250. The SSD controller 2210 may generate a test control signal for controlling the test of the buffer 2260 by driving the firmware or software including test code and may send the test control signal to the buffer 2260. In other embodiments, a function module, which performs a test, may be implemented by hardware in the SSD controller 2210.

The buffer 2260 may perform a characteristic test on an internal memory cell array based on the test control signal. At this time, the buffer 2260 may perform the test based on an acceleration condition to detect in advance a cell which is likely to be defective and may perform a repair process on the detected cell. Accordingly, the test for detecting a defective cell may be performed on the buffer 2260 in a state where the buffer 2260 is mounted in the SSD 2200 as well as in a manufacturing stage. Consequently, even when a failure is in progress in a memory cell, e.g., a VM cell, of the buffer 2260, the failure may be prevented, or reduced in likelihood, before a data error occurs and the integrity of the buffer 2260 may be more likely to be maintained.

Meanwhile, when an interrupt or a sudden power off occurs in the SSD 2200 during the test of the buffer 2260, a test history or test result of a test process performed in the buffer 2260 until that point may be stored in one of the memory devices 2230, 2240, and 2250 and the buffer 2260 may end the test. Thereafter, when the SSD 2200 enters again an idle state, the SSD controller 2210 may determine the status of the test process based on the test history or the test result stored in one of the memory devices 2230, 2240, and 2250 and may perform a test to continue from the determined status. As described above, the buffer 2260 may stop the test when an interrupt occurs in the SSD 2200 and then resume the test with continuity afterwards, so that the test of the buffer 2260 is performed without causing the performance of the SSD 2200 to decrease.

Figure 18:
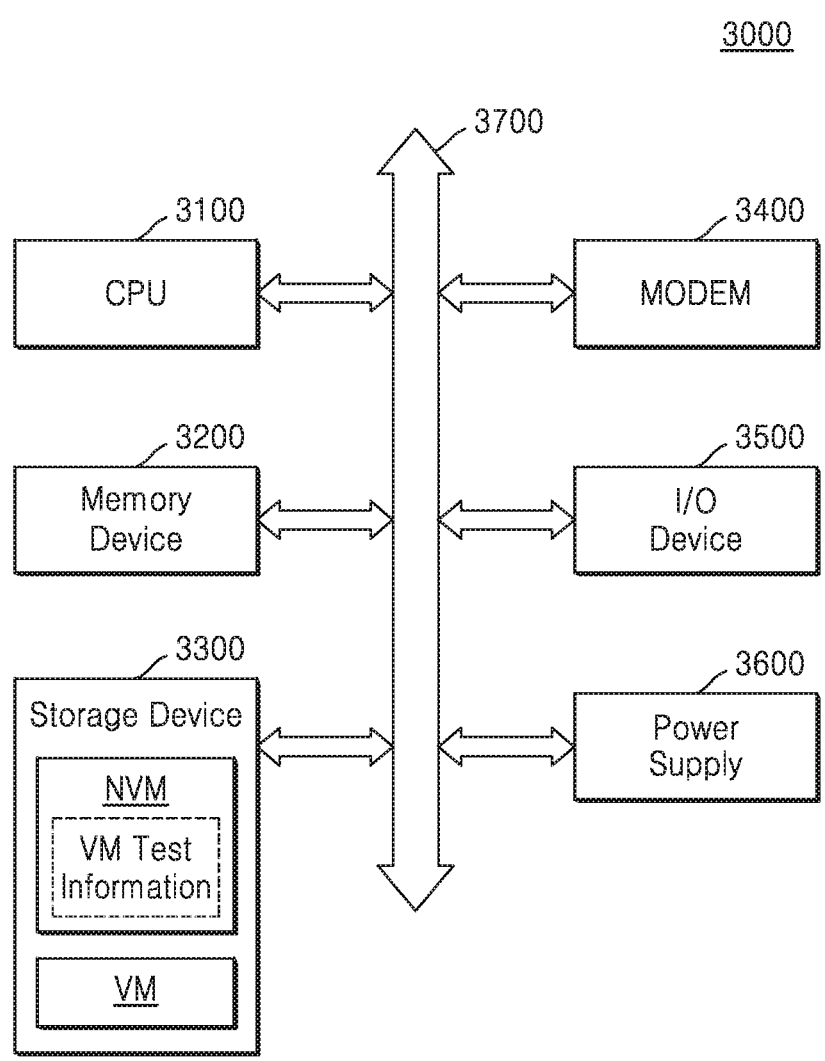
FIG. 18 is a block diagram of an electronic system according to an embodiment of inventive concepts.

FIG. 18 is a block diagram of an electronic system according to an embodiment of inventive concepts.

Referring to FIG. 18, an electronic system 3000 may include a CPU 3100, a memory device 3200, a storage device 3300, a modem 3400, an I/O device 3500, and a power supply 3600. A storage device described above with reference to one of the various embodiments may be used as the storage device 3300. Accordingly, the storage device 3300 may test a VM included therein in an idle state and may repair defective cells detected from the test. In addition, the storage device 3300 may store a test history and/or a test result in an NVM and use the test history and/or the test result in a test stage afterward.

While inventive concepts have been particularly shown and described with reference to embodiments thereof, it will be understood that various changes in form and details may be made therein without departing from the spirit and scope of the following claims.

What is claimed is:

1. A storage device comprising:
a non-volatile memory configured to store user data;
a volatile memory including a volatile cell array, the volatile memory configured to buffer the user data; and
a controller configured to control the volatile memory to perform a test for detecting a defective cell of the volatile cell array at an idle time of the storage device and configured to store, in the non-volatile memory, test information generated based on the test,
wherein the controller is configured to control the volatile memory to stop the test for detecting a defective cell of the volatile memory in response to an interrupt occurring while the test for detecting a defective cell of the volatile memory is being performed, configured to store, in the non-volatile memory, a test history of a test process performed until the interrupt occurs in response to the interrupt occurring, and configured to resume the test for detecting a defective cell of the volatile memory when the storage device enters the idle time again,
wherein the test history includes at least one of a test step of the test, a test condition of the test, or a test region of the volatile memory.

2. The storage device of claim 1, wherein the interrupt occurs in response to reception of a command from an external host.

3. The storage device of claim 1, wherein the test history includes address information of a region on which the test has been performed among a plurality of regions of the volatile memory.

4. The storage device of claim 1, wherein the test history includes information about at least one test step performed at the occurrence of the interrupt among a plurality of test steps, the plurality of test steps sequentially performed to detect the defective cell.

5. The storage device of claim 1, wherein the controller is configured, at a next idle time of the storage device, to determine a test process based on the test history, and the test process performed at the next idle time.

6. The storage device of claim 1, wherein the controller is configured to control the volatile memory to stop the test in response to sensing a sudden power off of the storage device, and the controller is configured to store the test information in the non-volatile memory about a test process the test process having been performed until the sudden power off is sensed.

7. The storage device of claim 1, wherein the volatile memory is configured to perform at least one of a write and read test on the volatile cell array based on an acceleration condition.

8. The storage device of claim 1, wherein the volatile memory is configured to replace the defective cell with a redundancy cell.

9. The storage device of claim 1, wherein the controller is configured to apply a recovery code for error correction to a bit corresponding to the defective cell.

10. The storage device of claim 1, wherein
the non-volatile memory is configured to store program code for performing the test; and
the controller is configured to read the program code from the non-volatile memory and is configured to send the volatile memory a test control signal instructing the volatile memory to perform the test based on the program code at the idle time.

11. The storage device of claim 1, wherein the volatile memory is configured to test at least one characteristic among a plurality of characteristics, the plurality of characteristics including a refresh characteristic, a frequency characteristic, an alternating current (AC) parameter characteristic, and a direct current (DC) parameter characteristic.

12. The storage device of claim 1, wherein the volatile memory is configured to perform the test sequentially on a plurality of regions of the volatile cell array, and the volatile memory is configured to temporarily store first data, which has been stored in a first region on which the test is performed among the plurality of regions, in a second region corresponding to a free region, and the volatile memory is configured to restore the first data in the first region after the test is performed on the first region.

13. The storage device of claim 12, wherein the first data is at least part of metadata of the non-volatile memory.

14. The storage device of claim 1, wherein the volatile memory is configured to perform the test a number of times at the idle time, the number of times based on variable test conditions.

15. The storage device of claim 1, wherein the controller is configured to send a test control signal instructing the volatile memory to perform the test at a next idle time in response to receiving a test request from a host.

16. The storage device of claim 1, wherein the volatile memory is configured to write a test pattern to the volatile cell array, and read the written test pattern from the volatile cell array for detecting a defective cell.

17. A storage device comprising:
a volatile memory configured to buffer user data;
a non-volatile memory configured to store the user data; and
a controller configured to control the non-volatile memory and the volatile memory,
the volatile memory including a plurality of memory cells and a plurality of redundancy cells,
the controller configured to control the volatile memory to test the memory cells of the volatile memory in response to a command from the controller at an idle time of the storage device, and configured to replace a defective cell of the volatile memory with a redundancy cell of the volatile memory by rerouting addresses corresponding to the defective cell to addresses corresponding to the redundancy cell,
wherein the controller is configured to control the volatile memory to stop the testing of the memory cells of the volatile memory in response to an interrupt occurring while the test is being performed, configured to store, in the non-volatile memory, a test history of a test process performed until the interrupt occurs in response to the interrupt occurring, and configured to resume the test for detecting a defective cell of the volatile memory when the storage device enters the idle time again.

18. The storage device of claim 17, wherein the volatile memory includes a repair information storing circuit, the repair information storing circuit configured to store an address of the defective cell.

19. A storage system comprising:
a host; and
a storage device,
the storage device including
a controller,
a volatile memory including a plurality of memory cells, the volatile memory configured to temporarily buffer user data,
a non-volatile memory configured to store the user data,
the controller configured to control the volatile memory to test the memory cells of the volatile memory at an idle time of the storage device to determine a defective cell of the volatile memory in response to a command from the controller,
the controller including,
a data recovery circuit configured to recover a bit corresponding to the defective cell by applying a recovery code to the bit corresponding to the defective cell,
wherein the controller is configured to control the volatile memory to stop the test of the memory cells in response to an interrupt occurring while the test is being performed, configured to store, in the non-volatile memory, a test history of a test process performed until the interrupt occurs in response to the interrupt occurring, and configured to resume the test for detecting a defective cell of the volatile memory when the storage device enters the idle time again.

20. The storage system of claim 19, wherein the data recovery circuit is configured to store fail bit information corresponding to the defective cell.

* * * * *